United States Patent [19]

Dunkel

[11] Patent Number: 5,218,299

[45] Date of Patent: Jun. 8, 1993

[54] METHOD FOR CORRECTING SPECTRAL AND IMAGING DATA AND FOR USING SUCH CORRECTED DATA IN MAGNET SHIMMING

[76] Inventor: Reinhard Dunkel, 470 South 1300 East, No. 1004, Salt Lake City, Utah 84102

[21] Appl. No.: 675,401

[22] Filed: Mar. 25, 1991

[51] Int. Cl.⁵ .................................................. G01R 33/20
[52] U.S. Cl. .................................................. 324/307
[58] Field of Search ............... 324/300, 307, 308, 309, 324/310, 311, 312, 313, 314

[56] References Cited

U.S. PATENT DOCUMENTS 4,876,507 10/1989 Van Vaals ........................... 324/307

OTHER PUBLICATIONS

Ernst, Journal of Magnetic Resonance, 1969, 1, 7.
Montigny et al., Analytical Chemistry, 1990, 62, 864.
Siegel, Analytica Chimica Acta, 1981, 133, 103.
Daubenfeld et al., Journal of Magnetic Resonance, 1985, 62, 195.
Brown et al., Journal of Magnetic Resonance, 1989, 85, 15.
van Vaals and van Gerwen, Journal of Magnetic Resonance, 1990, 86, 127.
Sotak et al., Journal of Magnetic Resonance, 1984, 57, 453.
Herring, F. G., Philips, P. S. Journal of Magnetic Resonance, 1984, 59, 489.
Craig, E. C., Marshall, A. G., Journal of Magnetic Resonance, 1988, 76, 458.
Cieslar et al., Journal of Magnetic Resonance, 1988, 79, 154.
Chmurny and Hoult, Concepts in Magnetic Resonance, 1990, 2, 131.
Ernst, The Review of Scientific Instruments, 1968, 39 (7), 988.
Craig and Marshall, Journal of Magnetic Resonance, 1986, 68, 283.

Primary Examiner—Michael J. Tokar
Attorney, Agent, or Firm—Mallinckrodt & Mallinckrodt

[57] ABSTRACT

Spectral and imaging data can be corrected for various types of distortion, such as phase and baseline distortion, by fitting a mathematical model of the expected data to the experimental data. The model includes parameters relating to the distortions to be corrected. The model is fitted to the data by adjusting the parameters of the model, generally through a regression analysis, and when a best fit is obtained, the parameters resulting in the best fit provide the information necessary to correct the data. For example, phase parameters determined in fitting the model to the data can be used to determine a phase function to be applied to the data to phase correct the data, or the various other parameters determined may be used in the model with the phase parameters set to zero to calculate the simulated phase corrected data. Parameter for baseline or other distortions may be similarly obtained and used. The method of the invention may be used to produce phase and baseline corrected spectra, or the corrected data may be used in further aspects of the invention such as in magnet shimming wherein phased spectral data is used in connection with a magnet shim coil distortion model or in connection with movement minimization of the resonance frequency distribution to direct the shimming of magnets.

34 Claims, 22 Drawing Sheets

| LINE SHAPE | ABSORPTION $A(\omega)$ | DISPERSION $D(\omega)$ |
|---|---|---|
| LORENTZIAN | $\dfrac{\tau}{1+(\omega-\omega_o)^2\tau^2}$ | $\dfrac{(\omega-\omega_o)\tau^2}{1+(\omega-\omega_o)^2\tau^2}$ |
| SINC | $\dfrac{\sin[(\omega-\omega_o)T]}{\omega-\omega_o}$ | $\dfrac{1-\cos[(\omega-\omega_o)T]}{\omega-\omega_o}$ |
| LORENTZIAN CONVOLUTED WITH SINC FUNCTION | $\dfrac{\tau}{1+(\omega-\omega_o)^2\tau^2}[1+\exp(-T/\tau)\times \{(\omega-\omega_o)\tau\sin[(\omega-\omega_o)T]-\cos[(\omega-\omega_o)T]\}]$ | $\dfrac{\tau}{1+(\omega-\omega_o)^2\tau^2}[(\omega-\omega_o)\tau-\exp(-T/\tau)\times \{(\omega-\omega_o)\tau\cos[(\omega-\omega_o)T]+\sin[(\omega-\omega_o)T]\}]$ |
| GAUSSIAN | $\dfrac{1}{\sqrt{2\pi}\sigma}\exp\left(-\dfrac{(\omega-\omega_o)^2}{2\sigma^2}\right)$ | $\dfrac{1}{\pi}\int_{-\infty}^{\infty}\dfrac{A(\omega')}{\omega-\omega'}d\omega'$ |
| LORENTZIAN LINES WITH GAUSSIAN DISTRIBUTION OF PEAK POSITIONS | $\dfrac{1}{2\pi\sigma}\int_{-\infty}^{\infty}\dfrac{\tau}{1+(\omega-\omega_o+\Delta)^2\tau^2}\exp\left(-\dfrac{\Delta^2}{2\sigma^2}\right)d\Delta$ | $\dfrac{1}{2\pi\sigma}\int_{-\infty}^{\infty}\dfrac{(\omega-\omega_o+\Delta)\tau^2}{1+(\omega-\omega_o+\Delta)^2\tau^2}\exp\left(-\dfrac{\Delta^2}{2\sigma^2}\right)d\Delta$ |

*Fig. 2.*

Chemical Shift [ppm]

Chemical Shift [ppm]

| | | |
|---|---|---|
| A | GET COMPLETE SPECTRUM OR SPECTRAL REGION | $\vec{G}$ |
| B | CALCULATE BASELINE FUNCTION FROM BASELINE PARAMETERS | $\vec{B} = f(b_0,...,b_n)$, e.g. Eq. 9 |
| C | SUBTRACT BASELINE FUNCTION FROM SPECTRUM | $\vec{G}' = \vec{G} - \vec{B}$ |
| D | CALCULATE PHASE FUNCTION FROM PHASE PARAMETERS | $\varnothing'(\omega) = \sum_{j=0}^{m} \varnothing_j \omega^j$, Eq. 3 |
| E | APPLY PHASE FUNCTION TO THE SPECTRUM | $\vec{F} = \vec{G}' e^{i\varnothing'(\omega)}$, Eq. 4 |
| F | CALCULATE DESIGN MATRIX FROM PREDETERMINED LINE SHAPE FUNCTION AND LINE SHAPE PARAMETERS | $\hat{A}$, e.g. Eq. 8 Functions: Fig. 2 & Eq. 6 |
| G | SOLVE SET OF LINEAR EQUATIONS FOR INTENSITIES E.G. REAL-VALUED INTENSITIES IN A LEAST-SQUARES SENSE | $\hat{A} \times \hat{I} = \hat{F}$, Eq. 7 $\hat{I} = (\hat{A}^T \hat{A})^{-1} \hat{A}^T \times \vec{F}$ |
| H | PENALIZE UNFAVORABLE DETERMINED INTENSITY VALUES E.G. SET NEGATIVE INTENSITIES TO ZERO | $\vec{I}' = f'(\vec{I})$ |
| I | SIMULATE THE SPECTRUM | $\vec{F}_{sim} = \hat{A} \times \vec{I}'$ |
| J | DETERMINE SPECTRUM OF RESIDUALS | $\vec{R} = \vec{F} - \vec{F}_{sim}$ |

*Fig. 14.*

Distance From Sample Center

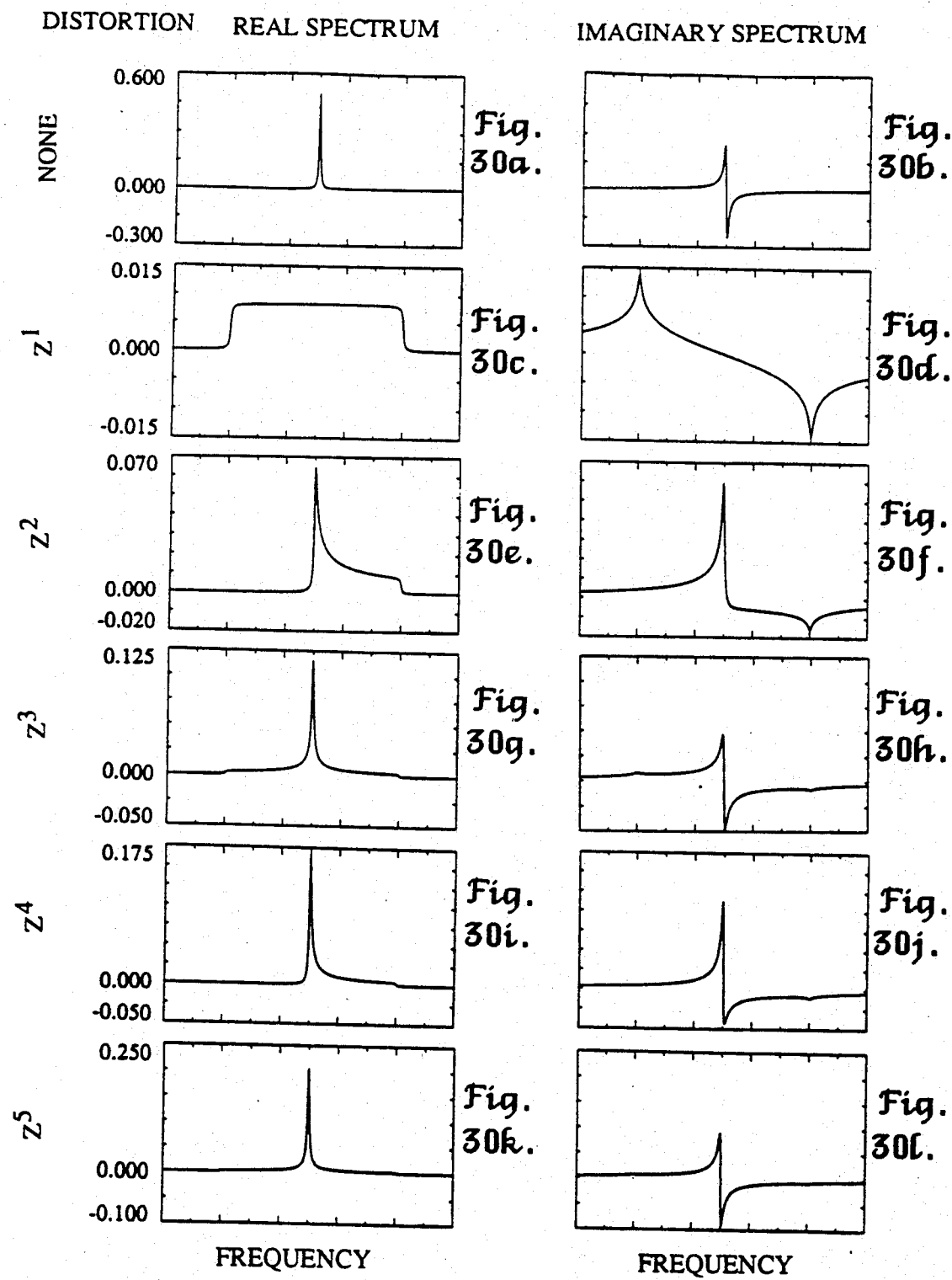

METHOD FOR CORRECTING SPECTRAL AND IMAGING DATA AND FOR USING SUCH CORRECTED DATA IN MAGNET SHIMMING

BACKGROUND OF THE INVENTION

1. Field

The invention is in the field of phase and baseline correction of N-dimensional data such as spectral or imaging data, in need of such correction, obtained through nuclear magnetic resonance, electron spin resonance, ion cyclotron mass spectrometry, etc. The invention also applies to the field of shimming magnets used in equipment for collecting spectral or imaging data to increase the uniformity of fields produced by such magnets.

2. State of the Art

Various methods are used to obtain spectral or imaging data for a variety of purposes. The data obtained may be collected directly in the time or frequency domain or be converted from the time domain to the frequency domain through a Fourier Transform (FT). Data are usually obtained by perturbing an object to be studied and measuring the response from the object. For example, in nuclear magnetic resonance (NMR), an object is subjected to magnetic fields varying in both time and space. In the case of magnetic resonance imaging (MRI), the spatial variation of the fields is of crucial importance. In the case of both imaging and spectroscopy, pulses of radio frequency electromagnetic energy are applied to cause a resonance phenomenon. Detectors measure the magnetic fluctuation in the object under study and provide data that are evaluated to determine various characteristics of the object. These magnetic fluctuations are oscillatory, and the frequency, phase and amplitude of the oscillations carry information about the sample. Because of various characteristics of the instrumentation, the phase and amplitude of the signals may be distorted. In order to obtain maximum information from the data, it must be corrected to remove these instrumental artifacts.

The most common method currently in use to phase correct spectral data is to manually adjust phasing parameters until the experimental data exhibit expected visual properties as observed by a spectroscopist. The extent of correction that can be accomplished manually is limited, and the outcome is subject to the biases of the spectroscopist. With most steps of the data collection and processing being automated, manual phasing is a weak link in the process.

Where frequency domain data are used, such data are generally obtained from time domain data through Fourier transformation. Fourier Transform methods generally yield a complex spectrum, i.e., a spectrum consisting of a real and an imaginary part. Ideally, the real part of such a spectrum would contain pure absorption mode spectral responses and the imaginary part would contain pure dispersion mode signals. However, a mismatch between reference and detector reference phase will introduce frequency-independent phase shifts, while delays between excitation and acquisition, frequency sweep excitation, and delays introduced by electronic filtering will produce a frequency dependent mixture of the two modes. For higher-dimensional spectra there is a similar problem associated with each dimension, thus manual correction of multidimensional spectra can become extremely tedious or even impossible.

Methods to avoid phase correction by processing and displaying the information in a phase independent way are in frequent use. However, such methods usually reduce the information content of the data and for most purposes phase sensitive data are preferable.

A pure absorption mode spectrum can be obtained from phase sensitive data by properly mixing real and imaginary parts at every point in the spectrum, a process called phase correction. The pure absorption mode yields data with the best resolution and sensitivity. Also aliased peaks can be identified by their anomalous phases, a detection which is not possible for phase insensitive spectra. In addition, positive and negative intensities can be distinguished and, if the spectra are taken carefully, the area under an absorption signal is proportional to the number of nuclei generating the signal.

A properly phased complex one-dimensional (1D) spectrum can be written as $$F(\omega) = A(\omega) + i D(\omega) \quad [1]$$

wherein the real portion of the spectrum, $\text{Re}[F(\omega)] = A(\omega)$, contains the absorption mode signals, and the imaginary portion of the spectrum, $\text{Im}[F(\omega)] = D(\omega)$, the dispersion mode signals. In such equations, the angular frequency, $\omega$, has units of radians and is related to the frequency, $\nu$ by $\nu = \omega/(2\pi)$. An experimental spectrum, $G(\omega)$ can show frequency-dependent phase shifts and is related to the well-phased spectrum $F(\omega)$ by the phase function, $\phi(\omega)$, as follows:

$$G(\omega) = F(\omega) e^{-i\phi(\omega)} \quad [2]$$

Another notation in frequent use employs the opposite sign in the exponent and thereby shifts the phase angles by $\pi$. The relative phase shift between real and imaginary spectra would be $-\pi/2$ instead of $\pi/2$. Phase correction attempts to estimate $F(\omega)$ from the observed $G(\omega)$, typically by determining an approximate phase function $\phi'(\omega)$. Often, for two or more test signals in the o.; spectrum $G(\omega)$, the phase angles at the transition frequencies of the chosen lines are determined. The accuracy of manual and some autophasing methods is limited since underdigitized spectra always appear to be somewhat poorly phased due to the sinc character of the observed line shape, making it desirable to use more objective criteria for phase adjustment.

Since signal phases are generally a slowly varying continuous function of the resonance frequency, a best-fit polynomial can be used to interpolate the phases of the test lines so as to correct every point in the spectrum. Phases in 1D spectra can only be determined within a multiple of $2\pi$. In higher-dimensional spectra a simultaneous phase shift in two orthogonal directions of $\pi$ does not change the appearance of the spectrum and in either case, optimum phases for the test resonances might need to be shifted by $2\pi$ or $\pi$ before interpolation. The first two terms of a power series, the zero$^{th}$ and first order corrections $\phi_0$ and $\phi_1$, respectively, in:

$$\phi'(\omega) = \phi_0 + \phi_1 \omega + \phi_2 \omega^2 \quad [3]$$

are often sufficient to achieve a satisfactory adjustment. This approach of "frequency-dependent" phase shifts is the only widely used method but it is not an accurate way of phase correcting a spectrum. In reality, spectra are a sum of lines, each with its own frequency-independent phase. The phase angle of a signal tail is determined not by its position in the spectrum, but by the phase angle at the signal's transition frequency. The use of the approximate phase function for phase correction of the spectrum $G(\omega)$ according to $$F(\omega) = G(\omega) e^{i\phi'(\omega)} \qquad [4]$$

modifies the line shape of the signals by the frequency-dependent phase shift of this equation and introduces baseline undulations.

Typically, "difficult" 1D spectra and some 2D spectra are phased manually using the experience of a trained spectroscopist. In higher-dimensional spectra and in imaging applications, "phase-independent" methods are currently often used because the amount of data involved are too great for manual phasing.

Several methods have been proposed for the automated phase correction of ID spectra. Ernst published the first article on autophasing methods in the *Journal of Magnetic Resonance*, 1969, 1, 7. The first method described by Ernst calculates the zero[th] order phase angle $\phi_0$ with the following relationship:

$$\phi_o = \arctan\left(\frac{I_q}{I_r}\right) \qquad [5]$$

where $I_r$ is the integral of the real part of the entire spectrum and $I_q$ is the corresponding integral of the imaginary spectrum. The calculated angle is then used to phase correct the data. By replacing the integrals by amplitudes in Equation 5, Montigny et al., in a method described in *Analytical Chemistry*, 1990, 62, 864, determines the phases for individual points in the spectrum near the signal maximum. These determined phases ar then used to correct the data. The second method described by Ernst is based on the ratio of maximum to minimum signal excursion. This ratio becomes infinite for pure absorption mode signals and it is unity for a dispersion mode signal. Ernst changed the spectral phase to maximize this ratio by an iterative procedure. When the ratio is maximized, the data are supposedly phased. Using a Simplex algorithm, Siegel, in a method described in *Analytica Chimica Acta*, 1981, 133, 103, used the maximization of the area below the baseline as criteria for optimization. Daubenfeld et al., as described in the *Journal of Magnetic Resonance*, 1985, 62, 195, looked at both Ernst's second method criteria and Siegel's criteria and used an interpolation between spectral points with a Lorentzian line shape model to improve the optimization based on the criteria of maximum peak area, maximum signal height, and a new criterion, minimum remaining phase deviation, i.e., phase angle. If any one of these criteria are met, the data are assumed to be correctly phased by Daubenfeld's method.

Brown et al., *Journal of Magnetic Resonance*, 1989, 85, 15, used the Criteria of flat baseline and narrow line width at the base of the signal for phasing. Maximization of the number of spectral points inside a small region of amplitudes defined by the noise level around a flat baseline will yield phased spectra with signals in positive or negative absorption. Van Vaals and van Gerwen, *Journal of Magnetic Resonance*, 1990, 86, 127, proposed to determine the best spectral phasing by iteratively recalculating a crude spectral model with varying phase distortions, determining the phase function from the model and fitting this function to the phase function of the measured spectrum over both ends of the spectrum remote from the transition frequencies of lines of in vivo NMR spectra.

A plot of dispersion vs. absorption mode (DISPA), as described in Sotak et al., *Journal of Magnetic Resonance* 1984, 57, 453, Herring, F. G.; Phillips, P. S. *Journal of Magnetic Resonance*, 1984, 59, 489, and Craig, E. C.; Marshall, A. G. *Journal of Magnetic Resonance* 1988, 76, 458, initially used to analyze line shapes, allows one to determine the phase of an isolated Lorentzian line. If a Lorentzian line is misphased, the DISPA plot will show a circle with diameter equal to the absorption mode peak height rotated around the origin by the number of degrees equal to the phase misadjustment.

For the automated phase correction of symmetrical two-dimensional (2D) NMR spectra with absorptive in-phase diagonal (e.g., NOESY, HOHAHA, z-COSY), Cieslar et al., in *Journal of Magnetic Resonance*, 1988, 79, 154, proposed to maximize the sum of diagonal elements and subsequently to minimize the asymmetry of the diagonal peaks. For 2D spectra with dispersive (e.g., COSY) or absorptive-antiphase diagonal (e.g., DQF-COSY, E. COSY), the reverse must be carried out.

As long as the experimental spectrum has no baseline distortions, infinite signal-to-noise ratio (S/N), infinite digital resolution, and only isolated lines with Lorentzian line shapes, most methods described will produce a fairly well phased spectrum.

In real spectra, baseline distortions can be caused by several mechanisms and can hardly be avoided. Especially critical are instrumental artifacts like pulse breakthrough and probe ringing that distort the first few points in the FID and cause broad baseline distortions after FT. Long signal averaging times for dilute samples, strong and perhaps incompletely suppressed signals such as solvent lines, aliased dispersive tails of strong signals and unresolved broad resonances are further reasons for baseline distortions. None of the autophasing methods described so far is tolerant concerning these distortions. Especially sensitive are all methods based on integrals and van Vaal's method of determining phases from distant signals by fitting the phase function of a model to both ends of the phase function of the spectrum.

A method capable of phasing spectra at low S/N and low resolution will have to use all the information available concerning the signal phase. Methods based on only a few points around the signal maximum such as DISPA, maximum signal height, and ratio of maximum to minimum signal excursion neglect the phase information in the rest of a peak. Brown's method is limited to the phase information of the baseline and neglects the information of points at the signal maximum.

DISPA plots require at least three points with high S/N around the signal maximum and these points should have magnitudes above 60% of the magnitude maximum. This requires a rather well digitized spectrum. A typical carbon spectrum with line widths of 0.2 Hz and a spectral width of 200 ppm acquired on a 500 MHz instrument would require a digitization of $2^{18}$ ≈260,000 complex points, which is significantly higher than normally used for 1D spectra. This might be one of the reasons that Brown found this method to be "extremely unreliable for phasing typical $^1$H and $^{13}$C spectra." Similar problems ca be expected for all methods involving peak heights unless an interpolation with a line shape model is involved.

All methods are sensitive to signal overlap. In particular, the maximum of the spectral area doesn't correspond to a well-phased spectrum in the case of signal overlap.

Van Vaals, in U.S. Pat. No. 4,876,507, described a method involving the steps of:
(1) determining peak locations (e.g., for DISPA plots) from a modulus or power spectrum,
(2) correcting overlapping peaks by means of the peak parameters determined, and
(3) using a polynomial as a frequency-dependent phase function determined by a least-squares criterion to determine an overall phase function.

The determination of peak locations from a power spectrum has been shown by Herring and Phillips, *Journal of Magnetic Resonance*, 1984, 59, 495, and, using a best-fit polynomial as a phase function has been described by Daubenfeld et al., *Journal of Magnetic Resonance*, 1985, 62, 200, and by Craig and Marshall, *Journal of Magnetic Resonance*, 1988, 76, 461.

The Van Vaals patented method, as well as the other known methods described, while providing some measure of phase correction, leave much room for improvement in phase correction methods and results.

Much of the equipment used for obtaining the experimental data relies on a uniform magnetic field or linear magnetic field gradient during excitation of the object to be investigated. Any departure from these standards creates distortions which degrade resolution and signal-to-noise ratio of the data and are very difficult to correct after the data have been acquired. With such distortions, even when a signal is properly phase corrected, it may be difficult or impossible to obtain desired information from the signal. To avoid such distortions, in equipment such as nuclear magnetic resonance equipment, it is important that the magnetic field distortions over the sample volume be as small as possible. Improvements in field uniformity can be made by using additional magnetic fields produced by as many as 18 shim coils placed inside the main magnetic field. Such apparatus is shown in U.S. Pat. No. 3,569,823 as applied to superconducting solenoids and in U.S. Pat. No. 3,622,869 as applied to permanent magnets and electromagnets. The electrical current through these coils may be adjusted to cancel the inhomogeneity of the main magnet, a process called shimming. It is common for NMR spectra to contain features that are lifetime broadened only on the order of 5 parts in $10^{11}$. Current high resolution NMR superconducting magnets can be made homogeneous to the order of 5 parts in $10^{10}$ or better but may well be homogeneous to only one part per million without shimming. These shim currents are periodically adjusted to provide as uniform a main magnetic field as possible. Ideally, the shim currents should be adjusted for each object to be examined. Magnet shimming through adjustment of the current in the eighteen shim coils is generally done manually and is tedious and difficult due to the non orthogonality of the various shim coils.

The theory of shimming, magnetic field plots, and various methods of manual shimming are reviewed by Chmurny and Hoult in *Concepts in Magnetic Resonance*, 1990, 2, 131. Autoshimming routines have not found widespread acceptance due to their lack of reliability.

Ernst, in *The Review of Scientific Instruments*, 1968, 39(7), 998, suggested that criteria for use in determining magnetic field homogeneity could include various moments of an observed signal or derived criteria such as peak height and signal energy of a typical resonance line. Ernst suggested that such criteria might be used as a basis for automated adjustment of the magnet field homogeneity. Ernst compared the several methods and found that the peak height method was the most sensitive, and about four times more sensitive than a method using the second moment. The equipment used by Ernst had two shim coils. With only two shim coils, the peak height method in practice usually does not produce local optima of shim currents, thus, it is a simple matter to locate the desired global optimum. Because of the ease of determining peak height and the sensitivity with which peak height can be determined, it is the method that has been followed and is in general use today.

In today's equipment, where up to eighteen shim coils are used, the maximization of peak height is unreliable due to the presence of many inferior, local optima corresponding to different sets of shim settings. These local optima falsely indicate the desired global optimum and lead to incorrectly optimized shims. While Ernst recognized that false optima are not present using a moment criterion, he proposed that moments are difficult to determine because of noise and equipment problems and that moment measurements are insensitive. Further, the moment methods used by Ernst are limited to fine adjustments of the "spinning" shim coil currents because spinning of the sample creates spinning sidebands which have to be excluded from the analysis. To eliminate the spinning sidebands from the line shape analysis, the resonance region of the signal used must be limited to a narrow spectral region. This narrow window not only eliminates the spinning sidebands, but also eliminates signal tails which must be evaluated for proper determination of higher moments. Elimination of these tails destroys the argument that the moment methods do not produce local optima, i.e., if too small a window is used, a local optimum may be present.

Craig and Marshall in *Journal of Magnetic Resonance*, 1986, 68, 283 suggest minimization of the root-mean-square deviation from a best-fit Lorentzian to a frequency domain spectral peak and the minimization of the area under a radial difference DISPA plot as further methods of determining the optimum homogeneity of the magnetic field.

However, the minimization of the root-mean-square deviation from a best-fit Lorentzian suffers from insensitivity far away from the correct shim setting and local minima on the response surface might be encountered for this criterion. DISPA plots show similar distortions caused by phase and higher order shim misadjustments, and in said article only the sensitivity of z and $z^2$ shims produced easily identifiable effects on the DISPA plot.

Again, there is room for improvement in the shimming methods.

SUMMARY OF THE INVENTION

According to the invention, experimental spectral and imaging data can be evaluated and phase corrected using the invention and the phase corrected data used directly or used to determine corrections to be made in the data gathering equipment to reduce distortions introduced by such equipment. For example, the phase corrected data obtained by use of the invention may be used in a method of the invention for determining the adjustments to be made to shim coil currents in data gathering equipment to provide a more uniform magnetic field for such equipment.

In the phase correcting aspect of the invention, experimental spectral and imaging data that need phase correction are phase corrected by first estimating preselected parameters for at least one signal included in the data. The preselected parameters include parameters which define phase or phase relationships. The estimates of the preselected parameters for a particular signal are inserted into a predetermined mathematical model of the expected spectral data. Regression analysis is performed using the mathematical model with appropriate estimated parameters during which such estimated parameters are adjusted so that the values of the parameters providing the best-fit of the mathematical model to the actual signal are obtained. The adjusted phase parameters obtained through this regression analysis indicate the phase correction necessary to phase correct the data for each signal.

The mathematical model used will depend upon the data to be phase corrected and the preselected parameters to be initially estimated will depend upon the model used. In the simplest cases, where the data to be corrected consist of a plurality of separate, single, substantially homogeneous signals, the expected shape of such signals after phase correction is usually known and can be described mathematically as a known function such as a Lorentzian, Gaussian, sinc function, or convolutions thereof. Thus, the mathematical model used to define the experimental spectral data will define such data as a combination of the absorption mode and dispersion mode components of the expected phase corrected shapes to calculate a resultant signal as close as possible to the experimental data. If some of the signals in the experimental data are made up of overlapping signals, the model will not work well to describe such signals. If the overlapping signals are made up of two or more substantially homogeneous signals which overlap and display distinct maxima for each of the overlapping signals, an overlap model can be used to define such signals to take into account such overlapping of the single component signals. Finally, if a signal is substantially broadened without discernable maxima for essentially all of the component signals, as is usually the case with imaging data, such signals can be modeled using a more complex mathematical model which decomposes the signal into many overlapping signals. Such a decomposition model can be used to describe virtually all signals, whether a heterogeneously broadened signal or merely one or more single signals.

It is also desirable to be able to correct the experimental data for baseline distortion. This may advantageously be done by including a baseline term and baseline parameters in the mathematical model to define the contribution made to each signal by the baseline distortion. Using the adjusted baseline parameters, correction can then be made for baseline distortion.

Where data containing more than one signal are to be corrected, such as with most spectral data, the preselected parameters will be estimated for each of a plurality of signals present in the data, and preferably for each of the signals identifiable in the data, and a regression analysis is performed separately for each of the signals to obtain adjusted estimated parameters for each signal. These adjusted parameters are then used to phase correct the data and, since adjusted parameters are used for each identifiable signal in the data, very good phase correction is obtained over the entire frequency range of the data. Phase corrected data can be simply determined by using the adjusted phase parameters for each signal to obtain an overall phase correction function for the data. The phase correction function is then applied to the experimental data to obtain the phase corrected data.

Alternatively, the phase corrected data can be calculated using the mathematical model and the adjusted parameters with th phase parameters set to zero. This provides phase corrected simulated data which represent the phase corrected experimental data, but without the noise. However, various other information may be missing from the calculated data depending upon whether all signals were identified and included in the regression analysis and calculation. A preferred method for obtaining the phase corrected data when a number of separately identifiable signals are present in the data includes the calculation through regression analysis of the adjusted parameters as described. The adjusted parameters provide a best-fit of the mathematical model to the data. These calculated data are subtracted from the experimental data to be corrected. This leaves the residuals which include any signals that were not originally identified, or, for some other reason, for which parameters were not estimated and then adjusted, along with baseline distortion, distortions caused by an inhomogeneous magnetic field in the data collecting equipment, noise, and distortion signals resulting from the usual less than perfect fit. Using the adjusted phase parameters for each signal, a phase correction function is obtained. The phase correction function is applied to the residual data to provide phase corrected residuals. The adjusted parameters are used with the phase parameters set to zero to calculate, using the mathematical model, the phase corrected calculated spectrum. The phase corrected residuals are then added to the phase corrected calculated data to obtain the final composite corrected data. The final data corrected in this manner include all signals in the original data as well as any contribution due to missed signals, baseline distortion, and noise, but eliminate the distortions resulting from the identified signals for which calculated data are used. Thus, the corrected data include all information of the original data but has eliminated the most severe distortions.

It is preferred with the invention that once the initial regression analysis is performed for each of the initially identified signals, that those initially identified signals which are actually a set of separately identifiable overlapping signals be identified. These signals can usually be identified as those for which a good fit to the single line mathematical model was not obtained. However, other methods of identifying such sets of signals may be used such as identifying signal peaks and peak separation and comparing it to signal widths so if the peaks are closer together than a set fraction of the signal widths, an overlapping set is defined. Using the adjusted parameters for the overlapping signal sets from the single line model as initial estimates, regression analysis is performed for these identified sets of overlapping signals using an overlap mathematical model. The parameters are further adjusted through regression analysis for best-fit of the overlapping signal sets and those further adjusted parameters are used in conjunction with the parameters determined for the non-overlapping signals in determining a phase correction function. In the alternate methods of correction described, the further adjusted parameters for the overlapping sets are used to calculate and phase correct the data.

In instances where the data contain one or more bands made up of many overlapping, unresolved signals, the signal can be referred to as a heterogeneously broadened signal made up of a plurality of overlapping homogeneous signals which are not resolved into individual homogeneous signals. Such an unresolved band will occur occasionally in high resolution spectral data, but is frequently encountered in solid state or imaging data. In fact imaging data may contain only a single such spectral feature. Mathematical models representing the expected substantially homogeneous signals, or sets of overlapping separately identifiable signals as described above, cannot adequately describe the signal made up of many unresolved overlapping signals. In such a case, the mathematical model used in the invention to represent the data consists of a predefined decomposition of the heterogeneous signal into a superposition of many homogeneous signals. The signal is defined using a set of equations. The expected signal height at each location within the heterogeneous signal due to the superposition of all homogeneous signals at that location is equated to the actual measured height in the experimental data of the heterogeneous signal at that location. These equations include both linear and nonlinear parameters. By estimating the nonlinear parameters and keeping them constant in the equations, the equations become linear. The equations are then solved for the linear parameters which represent the intensity of each of th overlapping signals at their resonance frequencies within the band to provide the best overall solution of the equations with the fixed nonlinear parameters. Regression analysis is performed using the set of equations and adjusting at least some of the nonlinear parameters until the best-fit is obtained. These parameters are then used to phase correct the data. In such instances, it is preferred to use the adjusted phase parameters to determine a phase correction function and then to apply the function to the data to phase correct it.

Instead of the corrected experimental spectrum, it is sometimes desirable to use the deconvoluted spectrum represented by the best-fit linear model parameters that describe the intensity of the signal having its transition frequency at each location within the heterogeneous band. The resulting calculated signal eliminates the smearing effect created by the line width of the individual signals and provides an image of higher contrast, or, with spectral data, a higher spectral resolution.

Any data, spectral or imaging, and made up of any number of heterogeneous or substantially homogeneous signals, may be defined by the decomposition model which treats the data to be corrected as a plurality of overlapping homogeneous signals. However, because the decomposition model uses a set of functions which all have to be solved for each adjustment of the nonlinear parameters during the regression analysis, the evaluation of such a mathematical model is compute intensive. Therefore, where the data can be defined and corrected using the isolated signal model and/or overlap mathematical models described, use of these simpler models is preferred because less computer time is required to provide the adjusted parameters and the corrected data. However, if the set of equations used in the decomposition mathematical model describing the data as a plurality of overlapping homogeneous signals is implemented in special purpose hardware, it could easily be applied to all data to be corrected.

As indicated, in many cases, it will be desirable to correct the data for baseline distortion. It is preferred that th mathematical models used to define the signals include parameters defining the baseline contribution to the signals. These parameters are then adjusted during the regression analysis and the adjusted parameters may be used to determine an overall baseline correction function. This baseline correction function preferably includes both real and imaginary parts which are applied separately to the real and imaginary portions of the experimental data before combination of such signals to provide phase correction. Alternatively, baseline correction can be obtained if baseline parameters are not included in the mathematical model by subtracting the calculated data from the experimental data to obtain the residual data as previously described. Using the residual data, which generally clearly show the baseline distortion, a baseline distortion correction function can be determined. This correction function can be applied to the residual data to correct for the baseline distortion before adding the residual data to the calculated data, can be applied to the composite sum of calculated and residual data, or can be applied directly to the experimental data to correct for baseline distortion. In instances where the residual signal is difficult to fit into a baseline distortion correction function because of signals or other distortion in the residual signal, random noise is added to the residual signal at a level sufficient to disguise the signals or other distortion in the residual data for purposes of determining the baseline correction function.

In spectral or imaging devices, which rely on a uniform magnetic field or linear magnetic field gradient during excitation of the object being studied, the invention provides a substantially improved method for shimming the magnets used. According to the invention, a magnet may be shimmed by initially exciting a homogeneous object having a known data output signal, i.e., a standard, and obtaining the output of the equipment for such an object. With the invention, a program can automatically shim magnets by either including shim distortion in the model and using the best-fit shim parameters from the regression analysis for determination of the necessary corrections or by merely minimizing a moment of the observed resonance frequency distribution. Since the adjustment of shim currents is automatic, it can be performed before each run of data on an object to be evaluated. If it is not desirable to perform the magnet shimming procedure before each data run, it is easy with the invention to perform a data run, phase correct the data and if the phase correction is not successful in providing an expected output signal, to then go back and shim the magnet and retake the desired experimental data.

DRAWINGS

The best modes presently contemplated for carrying out the invention in actual practice are illustrated in the accompanying drawings, in which:

FIG. 1 is a graphic illustration of the construction of a signal in an unphased simulated spectrum as a sum of absorption, dispersion, and baseline components;

FIG. 2, a collection of absorption and dispersion mode formulas defining the most common symmetric line shapes encountered in spectroscopy;

FIG. 3, a phase angle vs. frequency diagram showing a hypothetical phase function;

FIG. 4, a phase angle vs. frequency diagram showing the phase angles of three signals in a hypothetical spectrum;

FIG. 5, a phase angle vs. frequency diagram showing removal of phase ambiguities by shifting phase angles 44 and 45 of FIG. 4 by $\pm 2\pi$;

FIG. 6, a phase angle vs. frequency diagram with the linear interpolation 46 of the left phase angle 43 and the middle phase angle 44 of FIG. 5, followed by a $2\pi$ phase shift of the remaining phase angle 45;

FIG. 7, a phase angle vs. frequency diagram with the linear interpolation 47 of the middle phase angle 44 and the right phase angle 45 of FIG. 5, followed by a linear reinterpolation 48 of all three phase angles;

FIG. 8, a Nassi-Shneiderman diagram of an autophasing method of the invention;

FIG. 9, a proton-decoupled $^{13}$C-NMR spectrum of 8 mg cholesterol with phase and baseline distortions;

FIG. 10, the spectrum of FIG. 9 after phase and baseline correction performed according to an embodiment of the invention, including expansions of various spectral regions;

FIG. 11, a diagram of determined phase and baseline parameter values vs. chemical shift frequency for the spectrum of FIG. 9;

Figure 15:
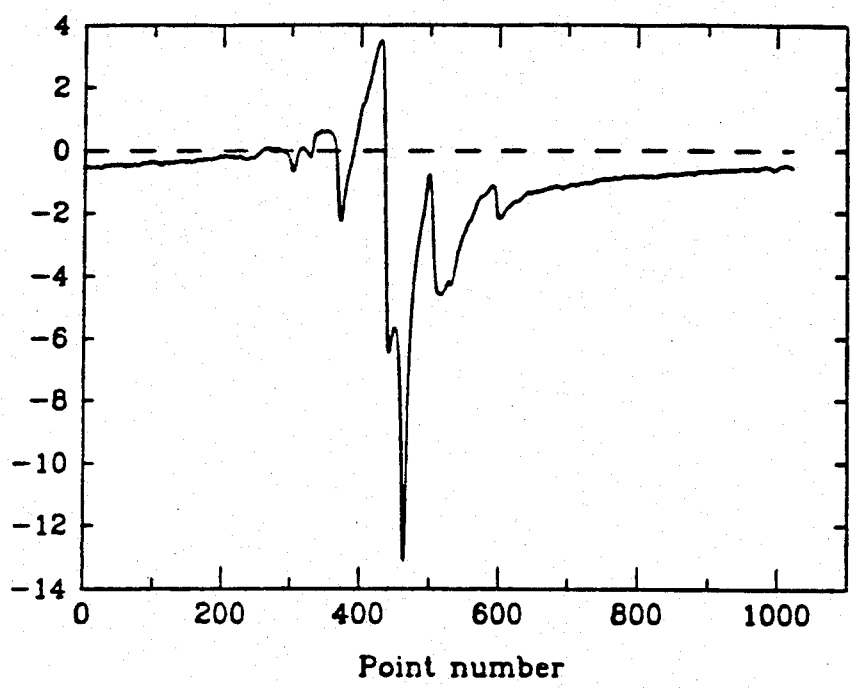
Figure 16:
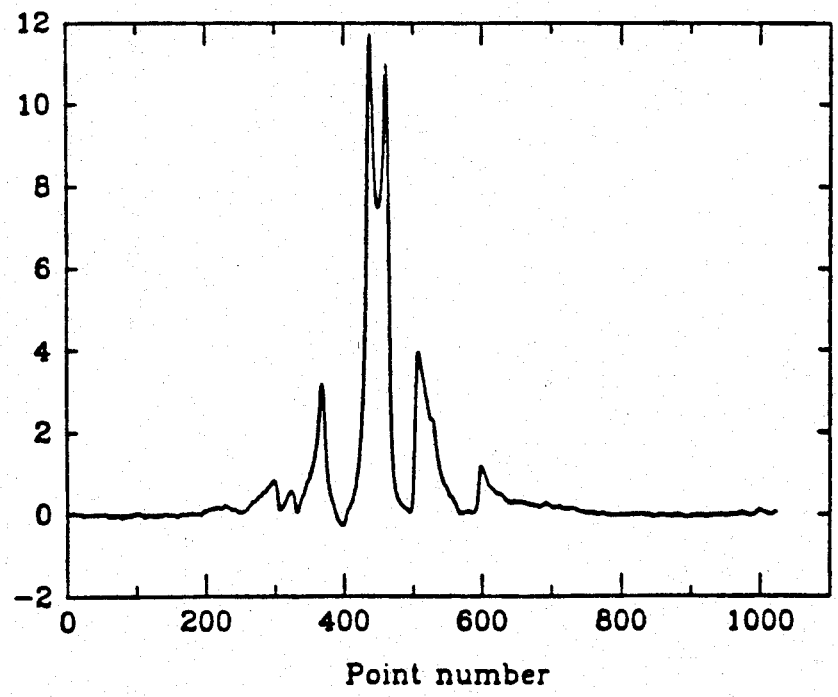
Figures 17A, 17B, 17C, 17D, 17E, 17F, 17G, 17H, 17I, 17J:
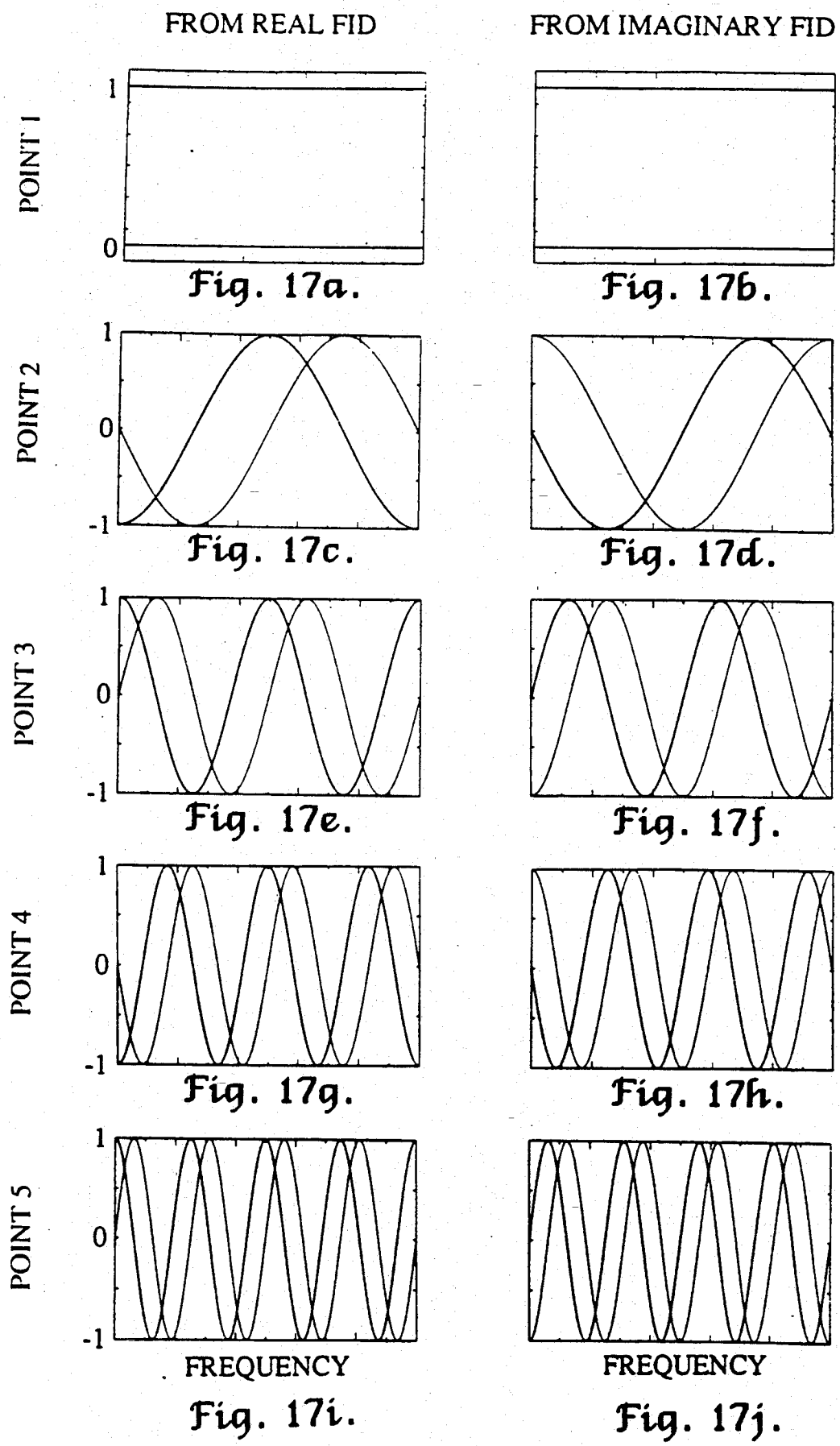
Figure 18:
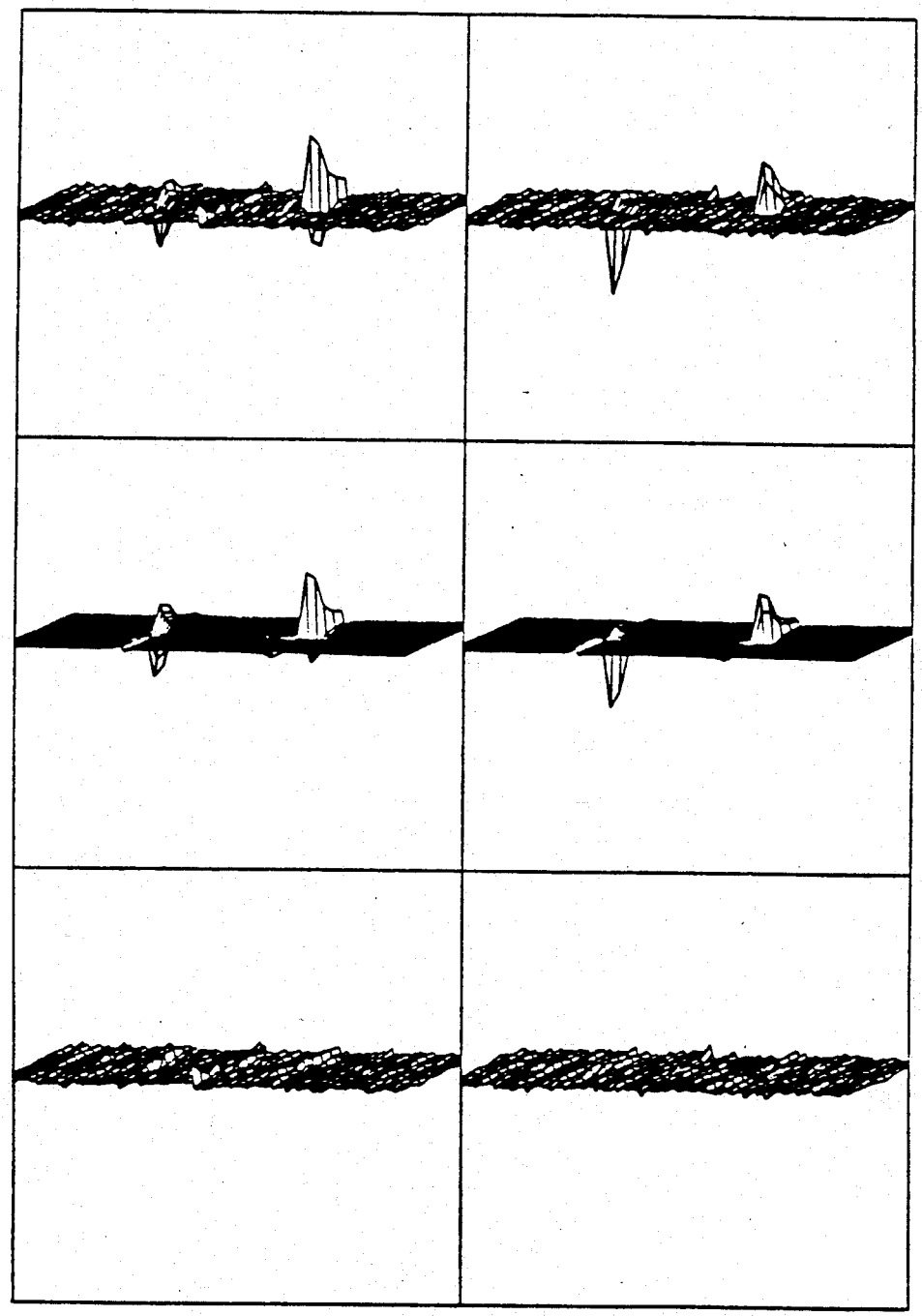
Figure 19:
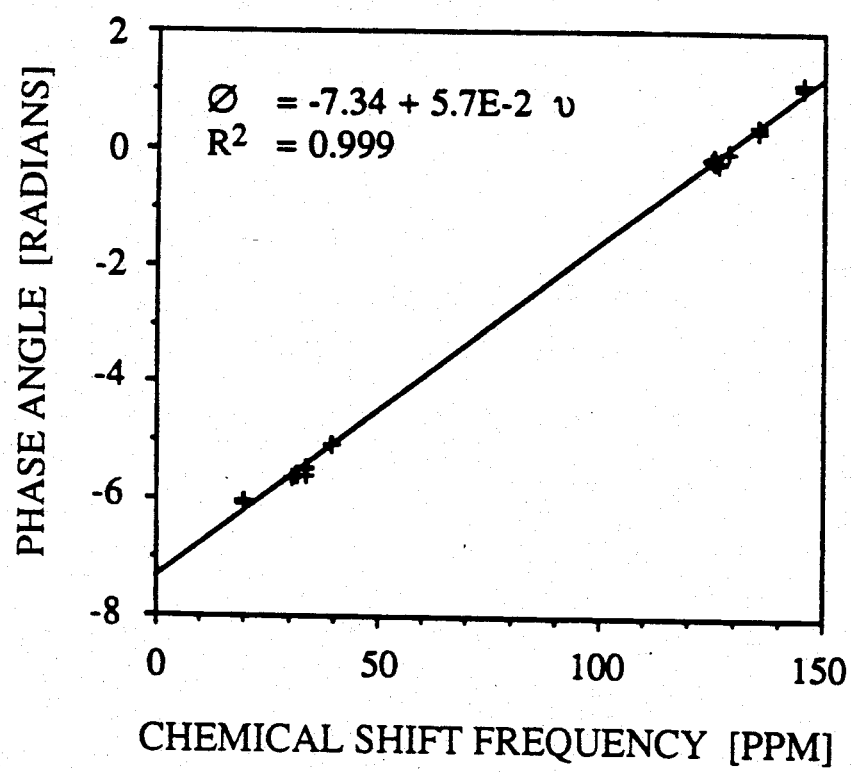
Figure 20:
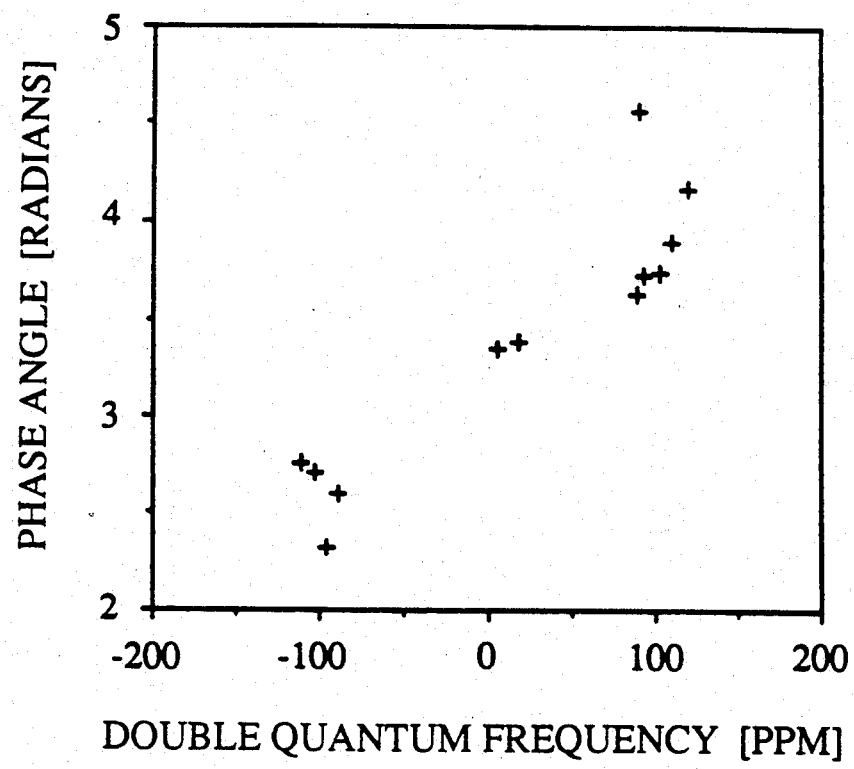
Figure 21:
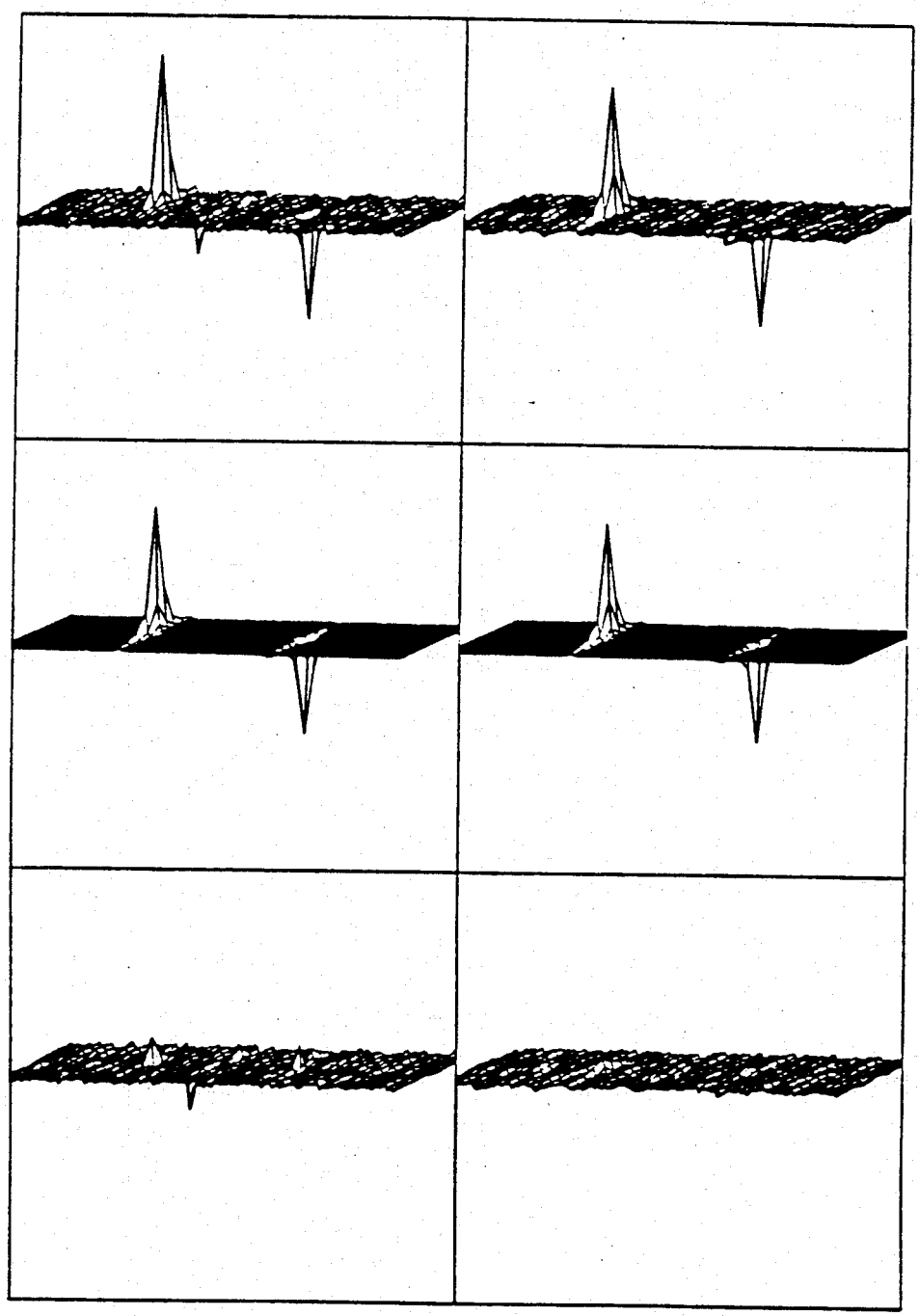
Figure 22:
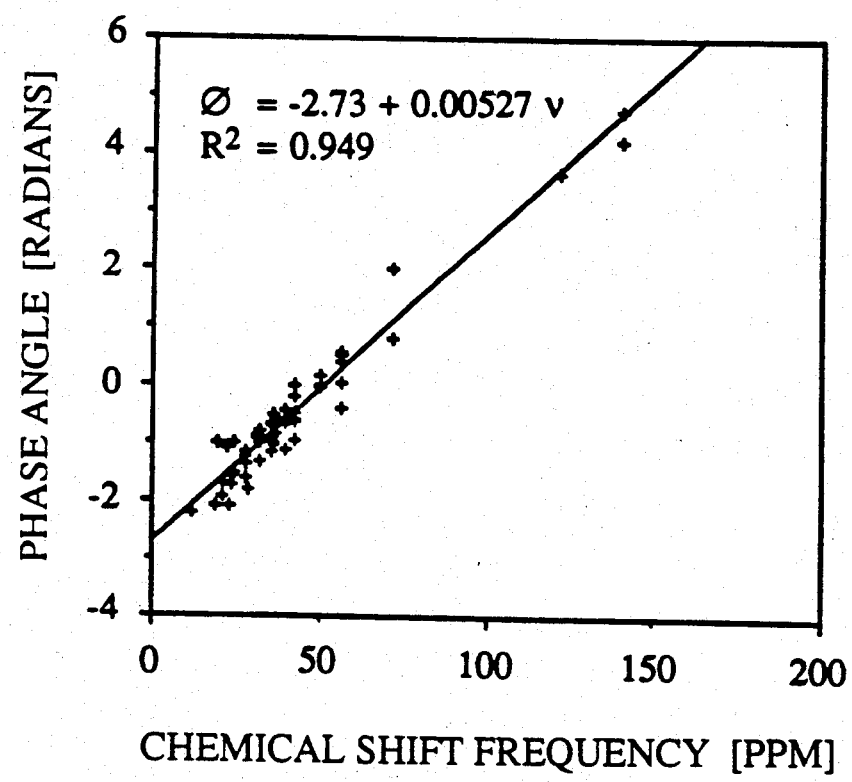
Figure 23:
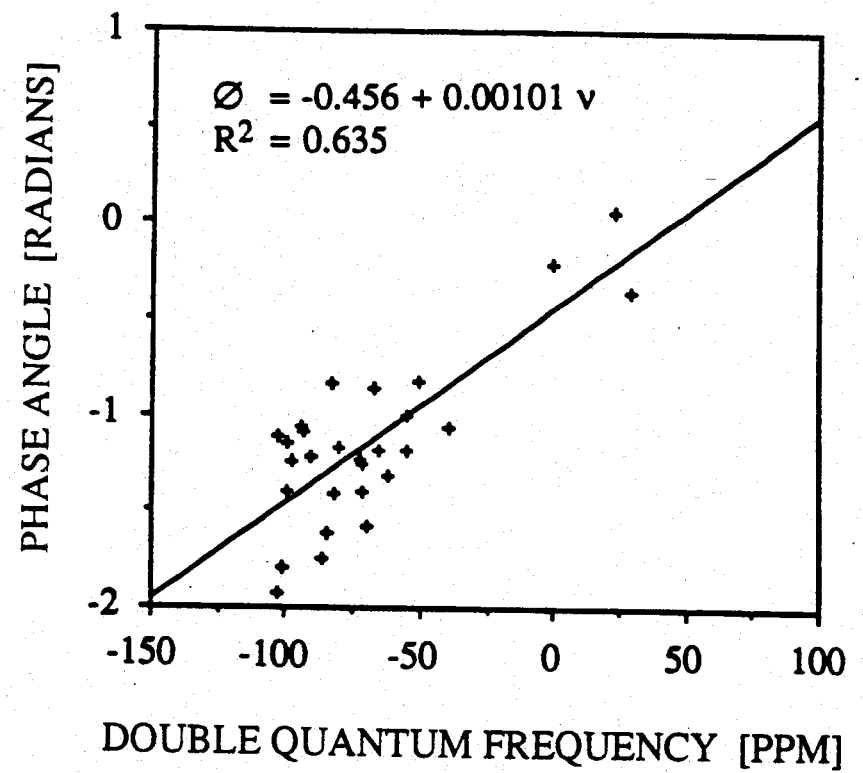
Figure 24:
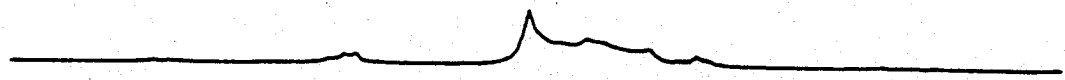
Figure 25:
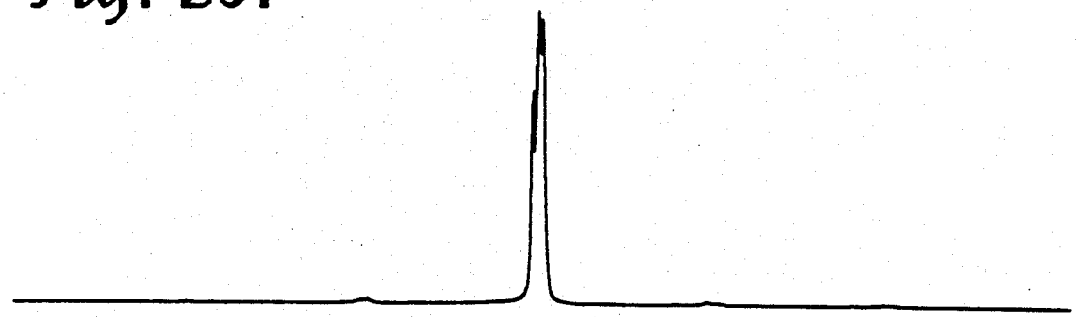
Figure 26:
Figure 27:
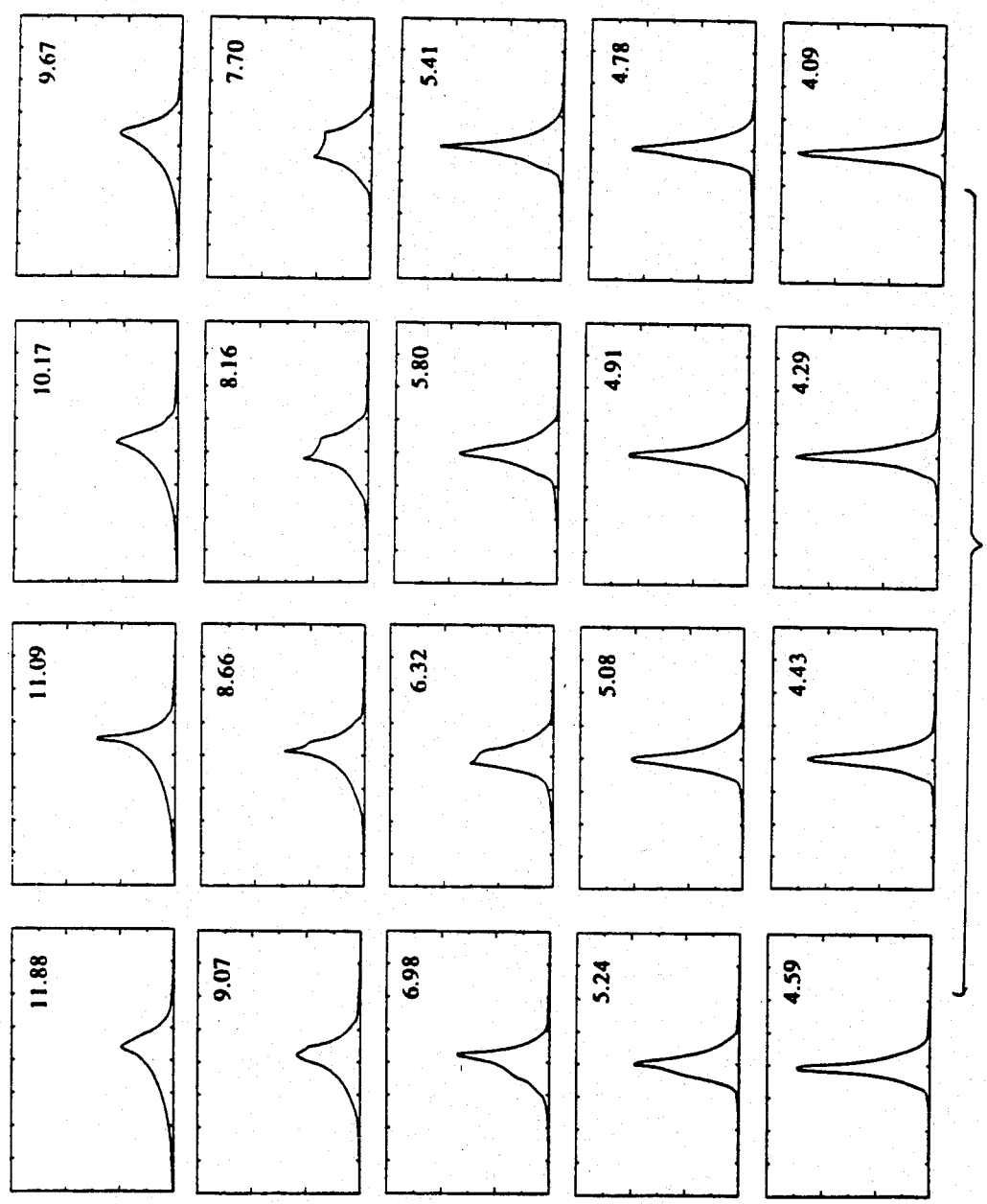
Figure 28:
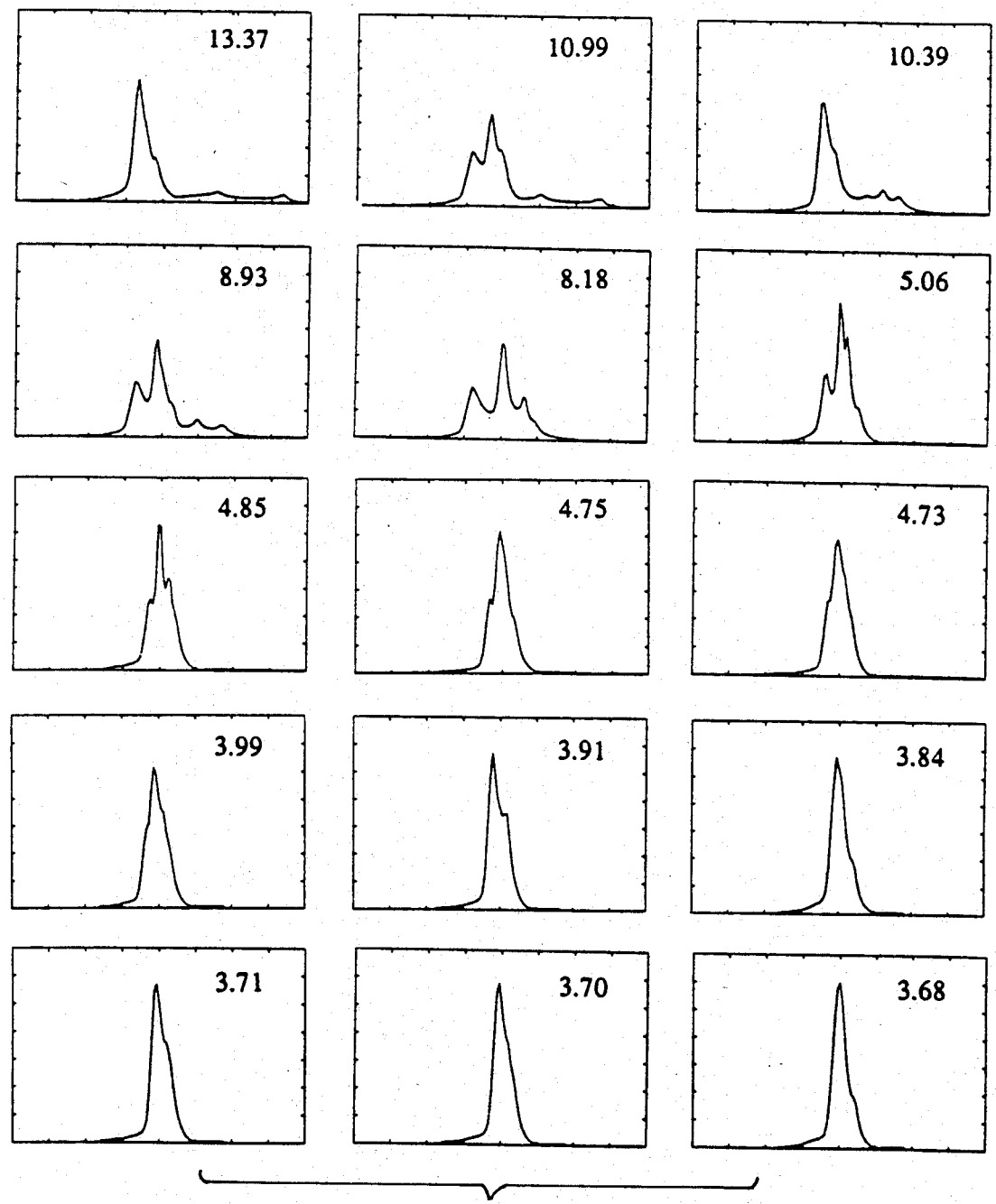
Figure 29:
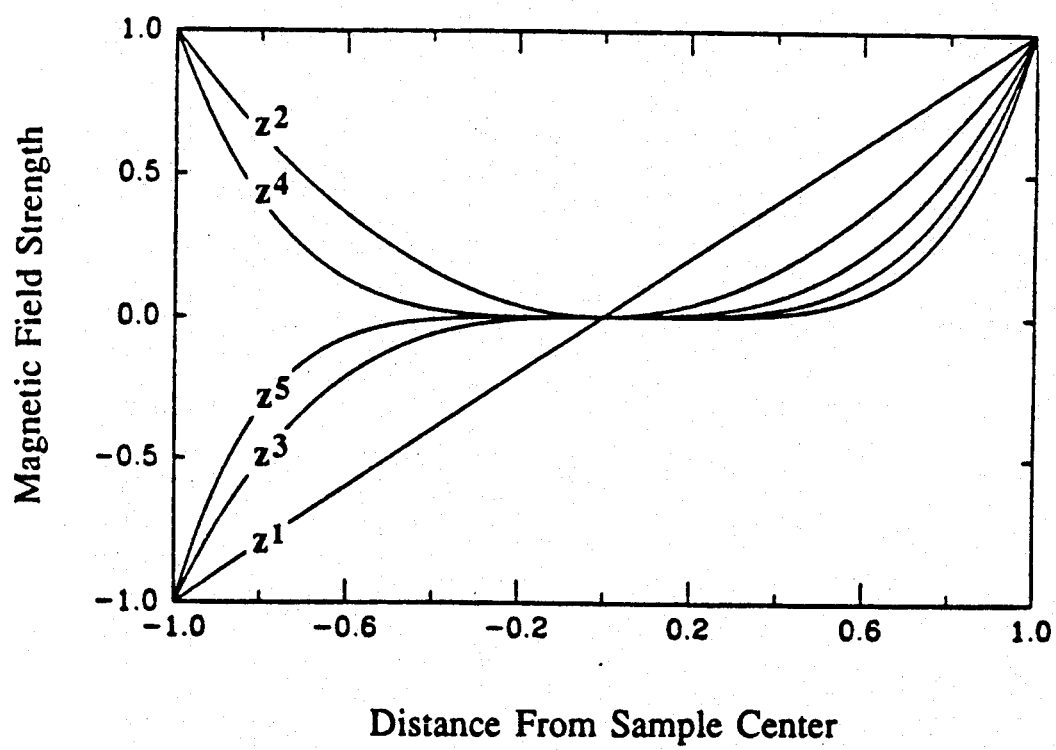

FIG. 14, a Nassi-Shneiderman diagram of a response function for the decomposition model;

FIG. 15, a $^{23}$Na-NMR spectrum of a Na$_2$MnO$_4$ powder sample with phase and baseline distortions;

FIG. 16, the spectrum of FIG. 15 after phase and baseline correction performed according to an embodiment of the invention;

FIG. 17a -17j are, graphic illustrations of distortions created in the real (17a, 17c, 17e, 17g, and 17i) (17b, 17d, 17f, 17h and 17j) of the first five points in the free induction decay (FID);

FIG. 18, a three-dimensional representation of, from top to bottom, the experimental, simulated, and residual bond region of a two-dimensional Incredible Natural Abundance Double Quantum Transfer Experiment (IN-ADEQUATE) spectrum before phase correction;

FIG. 19, a diagram of phase angle vs. chemical shift frequency for the phase angles in shift direction determined for all peak doublets of bond regions in the spectrum of 1,1-dimethyltetralin which includes both phase angles in horizontal direction of left and right windows in FIG. 18;

FIG. 20, a diagram of phase angle vs. double quantum frequency for the phase angles in double quantum direction determined for all bond regions in the spectrum of 1,1-dimethyltetralin which includes the phase angle for the bond region shown in FIG. 18;

FIG. 21, a three-dimensional representation of, from top to bottom, the experimental, simulated, and residual bond region of the spectrum in FIG. 18 after phase correction indicated by FIG. 19 for the shift direction and FIG. 20 for the double quantum direction;

FIG. 22, a diagram similar to that of FIG. 19 but for an 8 mg. cholesterol sample;

FIG. 23, a diagram similar to that of FIG. 20 but for the 8 mg. cholesterol sample used for FIG. 22;

FIG. 24, a spectrum of the residual proton resonance of a spinning D$_2$O sample acquired using an unshimmed 11.75 tesla magnet;

FIG. 25, a residual proton resonance spectrum for the sample of FIG. 24 after coarse shimming of the eighteen shim coils of the magnet according to an embodiment of the invention;

FIG. 26, a proton spectrum of a spinning sample of chloroform in acetone-d$_6$ with the shim settings from FIG. 25 after the fine adjustment of the spinning shims $z^1$ through $z^5$;

FIG. 27, a series of spectra of the non-spinning D$_2$O sample of FIG. 24 showing processed spectra during adjustment of the current through the shim coils during magnet shimming according to the invention, the first spectrum corresponding to the shim setting of FIG. 24 and the last spectrum corresponding to the shim setting of FIG. 25;

FIG. 28, a series of spectra of a spinning sample of chloroform in acetone-d$_6$ showing progressive spectra during shim adjustments of the five spinning shims of the magnet, the first spectrum corresponding to the shim settings of FIG. 25 and the last spectrum corresponding to the shim settings of FIG. 26;

FIG. 29, a magnetic field strength vs. distance from sample center diagram showing the theoretical field strength along the z-axis produced by the five spinning (z) shims;

FIGS. 30a-30h are, a series of calculated spectra showing a signal from a well shimmed magnet FIGS. 30a and 30b, as well as from an unshimmed magnet with variations in field strength over the sample volume as shown in FIG. 29 corresponding to distortions of the first ($Z^1$) spinning shims, FIGS. 30c and 30d, the second ($Z^2$) spinning shimes, FIGS. 30e and 30f, the third ($Z^3$) spinning shims, FIGS. 30g and 30h, the fourth ($Z^4$) spinning shims, FIGS. 30i and 30j, and the fifth ($Z^5$) spinning shims, FIGS. 30k and 30l.

DETAILED DESCRIPTION OF THE ILLUSTRATED EMBODIMENTS

While the invention may be practiced in several different specific embodiments, and such embodiments and their applications will be described separately, all embodiments are directed to or include the step of phase correcting experimental spectral or imaging data. All embodiments involve obtaining experimental data to be corrected for phase as well as, in most cases, other distortions present in the experimental data. Most experimental data will contain signals which, when properly phased, should have substantially known shapes, or are made up of a plurality of signals of substantially known shapes. As indicated in the Background section of the application, experimental data are made up of a combination of absorption mode signals and dispersion mode signals. By constructing a mathematical model which describes the expected shape of the data, or signals within the data, and including various parameters in the model to define various combinations of expected absorption mode and dispersion mode signals, the model parameters can be adjusted through regression analysis to provide a best-fit of the model to the data. In most embodiments of the invention, the model parameters will include phase parameters to be adjusted in fitting the model to the data. In a special case embodiment of the invention, the data itself will include the phase parameters that are adjusted, along with the model parameters, to obtain the best-fit of the model to the data. If a proper model has been chosen, the model should match well the experimental data and the phase parameters determined at that best-fit are the phase parameters needed to properly phase correct the experimental data, or to properly correct the data for other distortions pursuant to other parameters taken into account by the model.

The details of the invention will be described with respect to several different models that ma be used in connection with different types of data and in connection with use of the invention for the purpose of correcting experimental data for phase and other distortions, such as baseline distortion, and in connection with use of the invention for the purpose of correcting the external magnetic field used in data collecting equipment, generally referred to as magnet shimming.

The first step of the invention is to determine, from a power or magnitude spectrum, rough estimates of characteristic parameters of all lines or signals, such as transition frequencies, intensities, and line widths. No phase information can be obtained in this way and the accuracy of these values is limited by signal distortions due to overlap.

The initial comparison of a phase sensitive spectrum and the line shape model will show strong deviations due to inaccurately determined line shape parameters and the unknown spectral phase. These deviations, measured as the sum-of-squared residuals, can be decreased by either adjusting the phase of the spectrum or by adjusting the other model parameters. In contrast to prior art, which iteratively improves the phase of a single resonance by changing the spectrum to optimize a predefined criterion, in most cases, with the present invention, the data are kept unchanged while the phase is included in the model and adjusted with the other parameters to best describe the spectral region. While it is preferred in all cases to keep the data unchanged, in a special case, in order to increase the computational efficiency of fitting the model to the data the phase parameters are left out of the model and the phase of the data is changed as the parameters of the model are also changed to provide the best-fit.

This approach makes the well-developed methods of nonlinear regression analysis available for phase adjustment and signal characterization. The quadratically convergent Levenberg-Marquardt algorithm facilitates, especially in conjunction with analytical derivatives, rapid and reliable parameter estimation. An error analysis for every parameter allows an assessment of the goodness-of-fit, proper weighing of determined phases, and especially a unique distinction between signals and noise peaks.

The model can be constructed so that the phase parameter specifies which combination of absorption and dispersion mode describes the real and imaginary spectrum best. The equation for the possibly unphased simulated spectral data $G(\omega)$ can be derived from Equation 2:

$$G(\omega) = F(\omega)e^{-i\Theta(\omega)} = [A(\omega) + i\,D(\omega)](\cos\phi - i\sin\phi) \quad [6]$$

$$Re[G(\omega)] = A(\omega)\cos\phi + D(\omega)\sin\phi$$
$$Im[G(\omega)] = -A(\omega)\sin\phi + D(\omega)\cos\phi$$
$$= A(\omega)\cos(\phi + \pi/2) + D(\omega)\sin(\phi + \pi/2)$$

Figure 1:
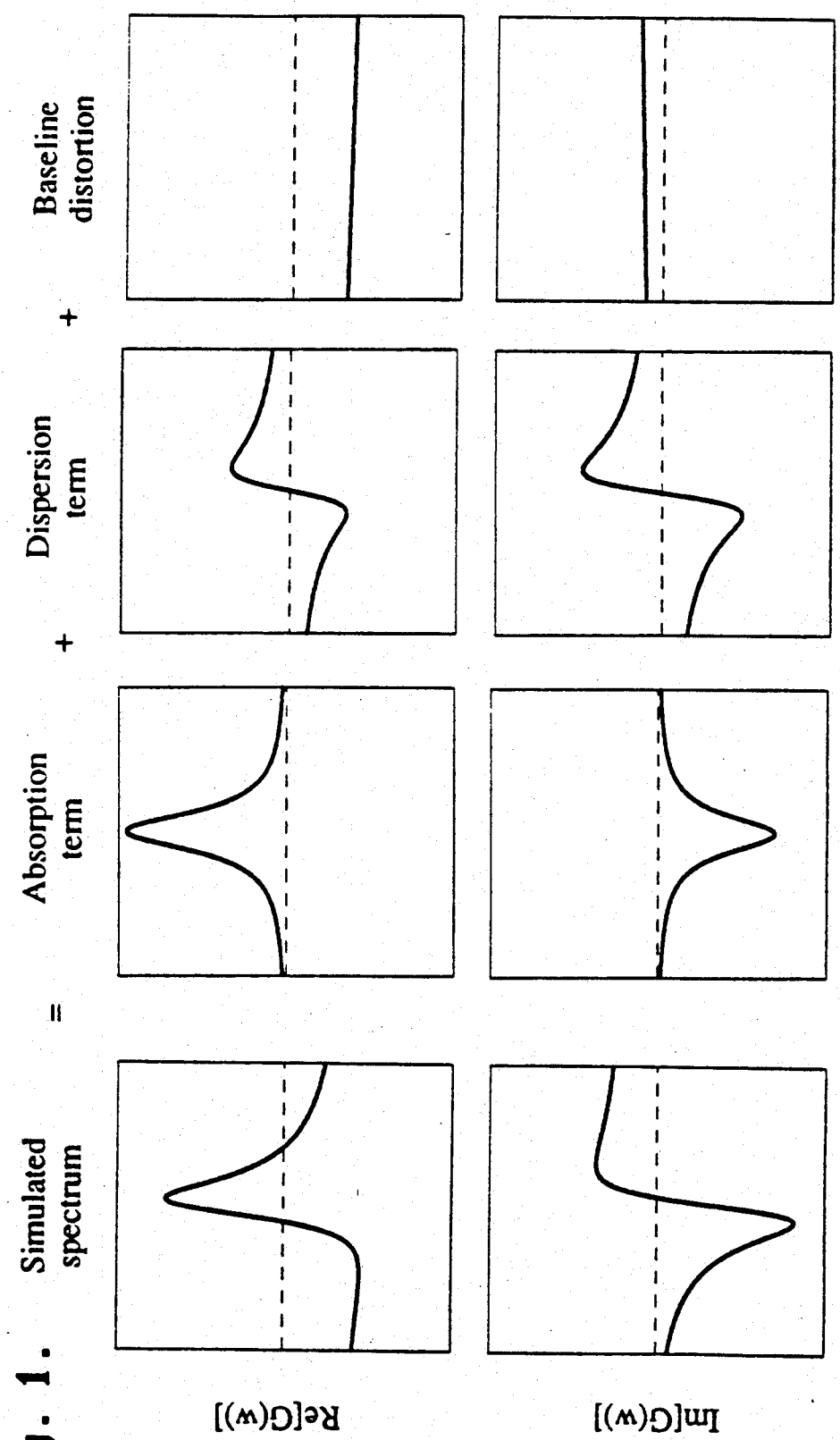

Baseline distortions and the influence of partly overlapping signals can be approximated by a term which is linear with respect to frequency in the vicinity of the transition frequency of the signal under consideration. This linear term can be incorporated into Equation 6 to eliminate the influence of baseline distortion and partially overlapping signals on the other parameter values. FIG. 1 shows the construction of the unphased simulated spectrum $G(\omega)$ as a sum of the absorption terms, $A(\omega)\cos\phi$ and $-A(\omega)\sin\phi$, the dispersion terms, $D(\omega)\sin\phi$ and $D(\omega)\cos\phi$, and the linear baseline distortion terms $b_0 + b_1(\omega - \omega_0)$ and $b_0' + b_1'(\omega - \omega_0)$ for an isolated line in both the real and the imaginary data sets. The fitting process of this model to a spectral region can be viewed as the determination of the best decomposition of the signal into these three components. The parameters of the absorption and dispersion terms provide the information needed for phase correction and the linear baseline terms provide the information for the correction of the baseline.

To avoid the removal of the tail of a strong resonance, zero$^{th}$ order baseline parameters, $b_0$ and $b_0'$, should be used for interpolation only for those regions whose corresponding first order terms are sufficiently small. Note that it is not necessary that a signal be detected in order to use the determined baseline parameters, as long as the fitting process converged.

The model will not generally be able to completely explain the signal power in a spectral region. The power in the simulated spectrum typically will be smaller than the power in the experimental spectrum, and equal to the spectral power only in the case of a perfect fit. Residuals, defined as the difference between the spectrum and its model, are normally random and are caused by noise in the spectrum. The approximate standard errors in the parameters can be used to assess the influence of random residuals on the parameter values. Only signals whose determined parameter precisions, i.e., the ratio of the parameter value to its uncertainty, have at least a chosen significance for all free parameters in the model should be considered valid signals. Non random residuals indicate a bad approximation of the observed signal by the line shape model, which, in many cases, will be due to the presence of severe signal overlap.

The choice of an appropriate line shape model consisting of absorption mode, $A(\omega)$, and dispersion mode, $D(\omega)$, functions depends on the spectrum under consideration. In high resolution NMR, this shape will almost always be of a Lorentzian type, characteristic of damped oscillatory motion. FIG. 2 contains formulas of symmetrical line shape models satisfactory for use with the method of the invention, and several other satisfactory formulas can be found in the book by Marshall and Verdun entitled *Fourier Transforms in Optical, and Mass Spectrometry*, Elsevier, Amsterdam, 1990. In the formulas of FIG. 2, the absolute value of $(\omega - f_0)$ is the distance from the resonance frequency and $\sigma$ is the width of a Gaussian line or Gaussian distribution of resonance frequencies.

The pure Lorentzian line shape requires a time-domain observation, where the transverse relaxation time $\tau$ is short compared to the acquisition time T. Particularly in higher dimensional spectroscopy, where digital resolution is severely limited due to the amount of available storage or available time for data acquisition, the opposite is frequently found, producing essentially sinc-shaped lines. The intermediate case, the Lorentzian line shape convoluted with a sinc function is probably the most useful model in the current context.

Gaussian lines can arise in spectroscopy directly, but are more frequently generated using weighting functions. The absorption mode Gaussian can be expressed in closed form while the calculation of the dispersion mode requires one of the numerical methods described by Wang and Marshall in *Analytical Chemistry*, 1983, 55, 2348. The given dispersion mode formula, known as the Hilbert transform, is a mathematical relationship which allows one to convert absorption into dispersion mode.

Inhomogeneous broadening of lines is found when normally equivalent spins in the sample resonate at different frequencies due to such effects as magnet inhomogeneity or temperature and concentration gradients. The Gaussian distribution of Lorentzian peaks of different position, known as the Voigt function, can be found in NMR spectra of polymers or adsorbed species. The absorption and dispersion mode of the Gaussian distribution can be normalized by dividing by the absorption peak height at the resonance frequency. The evaluation of both functions requires a numerical integration.

Even unsymmetrical signals can be phased in this way as long as a parametric model can be derived describing the pure absorption line shape. The invention will always produce, in a least-squares sense, the spectrum with line shapes as close to the specified model as possible. Even in cases of significant deviations between assumptions (model) and spectrum, the signal decomposition into basis functions will produce an approximate solution and an assessment of the quality of the fit. Complete failures encountered with other autophasing systems are highly unlikely as long as the postulated line shape bears a reasonable resemblance to the observed one.

Spectral line shapes are influenced only by the sine and cosine of the phase angle and hence the phase of a signal or group of signals can only be determined within $2\pi$ and might need to be shifted before interpolation by a phase function. The number of possible combinations of such shifts for n determined phase angles increases exponentially with n and exploration of all possibilities becomes prohibitive for any significant number of phases.

In NMR, the delay-time between excitation and detection is typically in the order of half of one analog-to-digital converter dwell period. The resulting linear phase shift usually creates less than one $\pi$ of phase variation across the spectrum. Only a few spectroscopic methods cause phase shifts of more than $2\pi$ across the spectrum ("phase wrapping").

A method has been developed as a part of the invention for correction of an essentially linear phase distortion over a spectral width not to exceed $n\pi$ across such spectral width, where n is typically, but not limited to, two. The computational requirements increase only linearly with the number of phases and the method provides an efficient means to shift and interpolate phase values.

Figure 3:
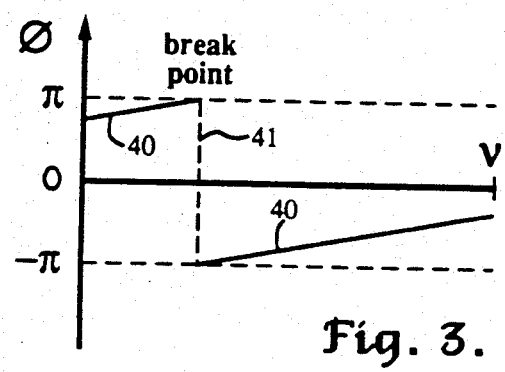

The method involves two main steps. First, the ambiguity in the determined phases is removed by shifting all phases into a minimal phase range. In FIG. 3 the range of $-\pi < \phi \leq \pi$ was chosen to remove the uncertainty caused by possible $2\pi$ phase shifts. Since phase angles are assumed to change linearly with resonance frequency, all determined phases will lie (in the absence of measurement errors) on the straight sloped line 40 shown in FIG. 3. This line can have one (and only one) break point for a maximum allowed phase shift of $2\pi$ across the spectrum. The break point is shown by the vertical broken line 41 in FIG. 3, and phase values on either side of the break point can have phase differences of up to $2\pi$.

The second step of the method eliminates the break point in the phase function. For three or more determined phase angles, a determined frequency/phase pair with equal, or approximately equal, number of phases at lower and higher resonance frequencies is chosen as the "midpoint". Three situations can occur:
1. The break point is on the left side of the midpoint.
2. The break point is on the right side of the midpoint.
3. No break point exists between the determined phases.

In situation 1, interpolation of the phase of the midpoint and all phases on the right side of the midpoint will yield the correct linear phase correction function. In situation 2, the interpolation of midpoint phase and all phases on the left side of the midpoint gives the correct result. Both situations can be distinguished by shifting those phases that were initially not included in the interpolation as close to the determined line as possible by phase changes of $\pm 2\pi$. In both cases, the interpolation is repeated including shifted and unshifted phases. The linear function which satisfies the constraint of the maximum phase shift across the spectral width or, in case both do, the one with the smallest weighted sum-of-squares is the best linear phase function. In situation 3, where there is no break point between the determined phases, the two determined lines for situations 1 and 2 are identical and no special treatment of this situation is necessary.

Figure 4:
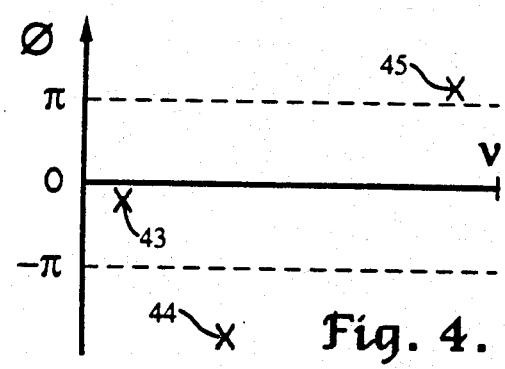
Figure 5:
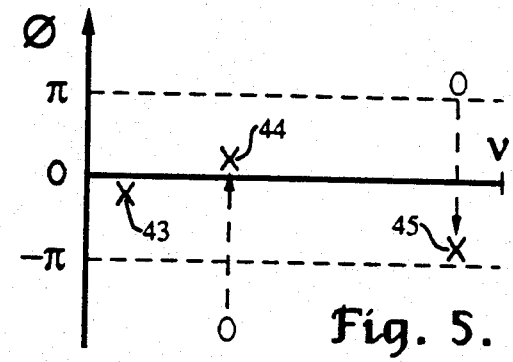
Figure 6:
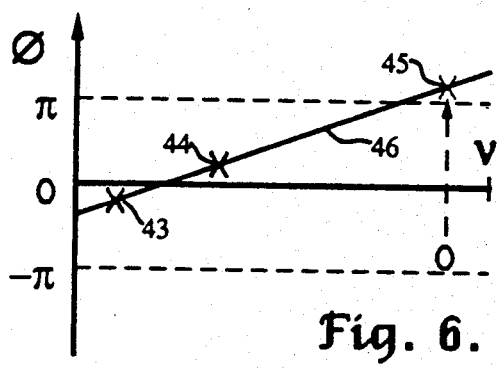
Figure 7:
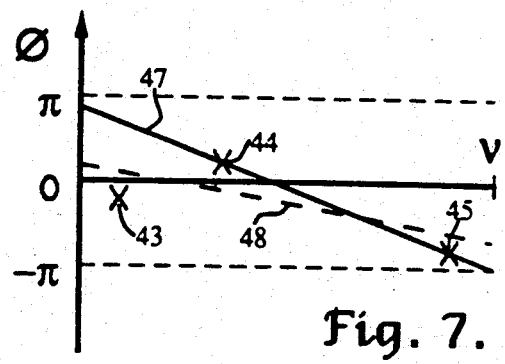

FIG. 4 shows an example of three determined phase angles from a hypothetical spectrum. The two phases 44 and 45 on the right side of the figure are outside of the $\pm \pi$ range so according to the method, need to be shifted inside the chosen spectral range of $-\pi < \phi \leq \pi$. As shown in FIG. 5, the determined phase angle 44 is shifted by $+2\pi$ into the desired range while the determined phase angle 45 is shifted by $-2\pi$ into the desired range. Phase angles 43 and 44 from FIG. 5 are then interpolated with the interpolation represented by line 46, FIG. 6, and the right hand phase 45 in FIG. 5 is shifted by $2\pi$ to a position as close to the line as possible. Reinterpolation of the three phases 43, 44, and 45 does not change the phase function represented by the original interpolation shown by line 46. Returning to FIG. 5, interpolation of the determined phases 44 and 45 is represented by line 47 in FIG. 7. Phase angle 43 is not close to the line and shifting by $2\pi$ does not bring phase angle 43 closer to line 47. Thus, an interpolation of the three phase angles 43, 44, and 45 is made and represented by the broken line 48. However, the fit of this phase function to the phase angles is worse than the fit obtained in FIG. 6 and since both lines satisfy the requirement of a maximum phase shift of $2\pi$ across the spectrum, the best possible phase function is the one from FIG. 6.

For a maximum phase change of $4\pi$ across the spectral width, shifting of phases in the range of $-\pi < \phi \leq \pi$ can produce up to two break points and three spectral regions have to be interpolated separately to determine the best phase function. Extension to higher phase shifts across the spectrum is possible, but limited by the number of determined phases and their accuracy. If the source of extensive phase shifts is known, such as time delays before data acquisition, an approximate phase correction should be calculated and applied to the determined phases before further phase corrections are determined.

In spectra where signals can be in positive and negative absorption, a phase value of $\phi = \pi/2$ could correspond to a positive absorption signal ($\phi = 0$) or a negative absorption signal ($\phi = \pi$) with a phase distortion of plus or minus $\pi/2$. Hence, phases have to be shifted initially in a range of $\pi$ (e.g. $-\pi/2 < \phi \leq \pi/2$) to remove ambiguities. For an allowed phase change across the spectrum up to $2\pi$, two break points can occur between phase values and three interpolations have to be determined as previously discussed. Signals in the corrected spectrum are in positive and/or negative absorption with dispersion components removed, but an uncertainty of $\pm \pi$ for the zero$^{th}$ order phase remains, which is an ambiguity inherent in the spectrum and not a characteristic of the algorithm.

The extension of the method to higher-dimensional spectra is slightly complicated by "coupled" phase shifts of $\pm \pi$ in two orthogonal directions of the spectrum which compensate each other in their effects.

In experimental spectra with low S/N ratios, it is advantageous to include as many phases of identified signals in the analysis as possible, weighted in the linear interpolations by the determined standard deviations of these values. In the case of a strong correlation between determined zero$^{th}$ and first order phase corrections it will normally be advantageous to determine and report only the best zero$^{th}$ order correction. The determination of parameter uncertainties and correlation coefficients for best-fit parameter estimates in a regression analysis is described in R. Dunkel et al., *Journal of Magnetic Resonance*, 1990, 90, 290.

Finally, there might not exist an overall phase function for all signals in a spectrum. Examples from NMR spectroscopy are spectra with partly suppressed (solvent) signals which show random phase or aliased lines ("ghosts") that exhibit the phase characteristic of their true position which lies outside the detected frequency range. The identification of such problems can be achieved by a goodness-of-fit test for the best-fit weighted linear phase function. Correction of such problems in general is difficult and might require additional information, e.g. interactive input from a spectroscopist. However, if only a minority of signals exhibit phase anomalies, outlier tests can be used to identify these signals and they can be excluded from further analysis. Generally, it will be desirable to provide some kind of indication when signals have been excluded to alert the spectroscopist of possible data or equipment problems.

If the overlap of signals gets so severe that resonances are only barely resolved, the determined parameters will deviate appreciably from the true line shape parameters. On average, these deviations cancel for symmetric patterns and tend to cancel for unsymmetrical patterns if the number of lines is sufficient. However, the suggestion in U.S. Pat. No. 4,876,507, to Van Vaals that "an excessive contribution to a line can be subtracted from a neighboring line" assuming a Lorentzian model and using parameter values determined from a magnitude spectrum is inexact. Unfortunately, lines always influence each other and parameters of one line used to correct other lines are incorrect for the very same reason.

Overcrowded regions can be identified by the parameter values determined for all signals in the spectrum. Since phase sensitive spectra are a true superposition of lines, a model consisting of a sum of lines in an overcrowded region can be used to fit the spectrum. Starting values are now the best-fit values of the preceding fit assuming isolated lines. All overlap is included in the model and will not influence the determined parameter values. The final values can also be used to calculate accurate integrals of signals in case of severe overlap.

For the distortion-free phase correction of a spectrum, a complete knowledge of all signals with associated line parameters is essential. However, even with partial deviation of the experimental from the simulated spectrum, spectral phasing distortions caused by signals identified and sufficiently characterized during the nonlinear regression analysis can be avoided. From the best-fit parameter values of all resonances, a reasonably accurate unphased spectrum can be simulated. Distortionless phase correction of these simulated data is as easy as recalculation of the simulated spectrum with phasing parameters set to zero. The spectrum of residuals, calculated as an unphased experimental minus a simulated spectrum, can be phased in the traditional way using an overall phase polynomial such as that described above. The phase corrected experimental spectrum is the sum of phased residuals plus the simulated spectrum with phase parameters set to zero. The intermediate spectrum of residuals also provides an excellent data set to determine and correct (additional) baseline distortions. Also the set of parameters might be edited before calculation of the phase corrected data, e.g. to selectively suppress unwanted spectral signals such as solvent resonances.

Figure 8:
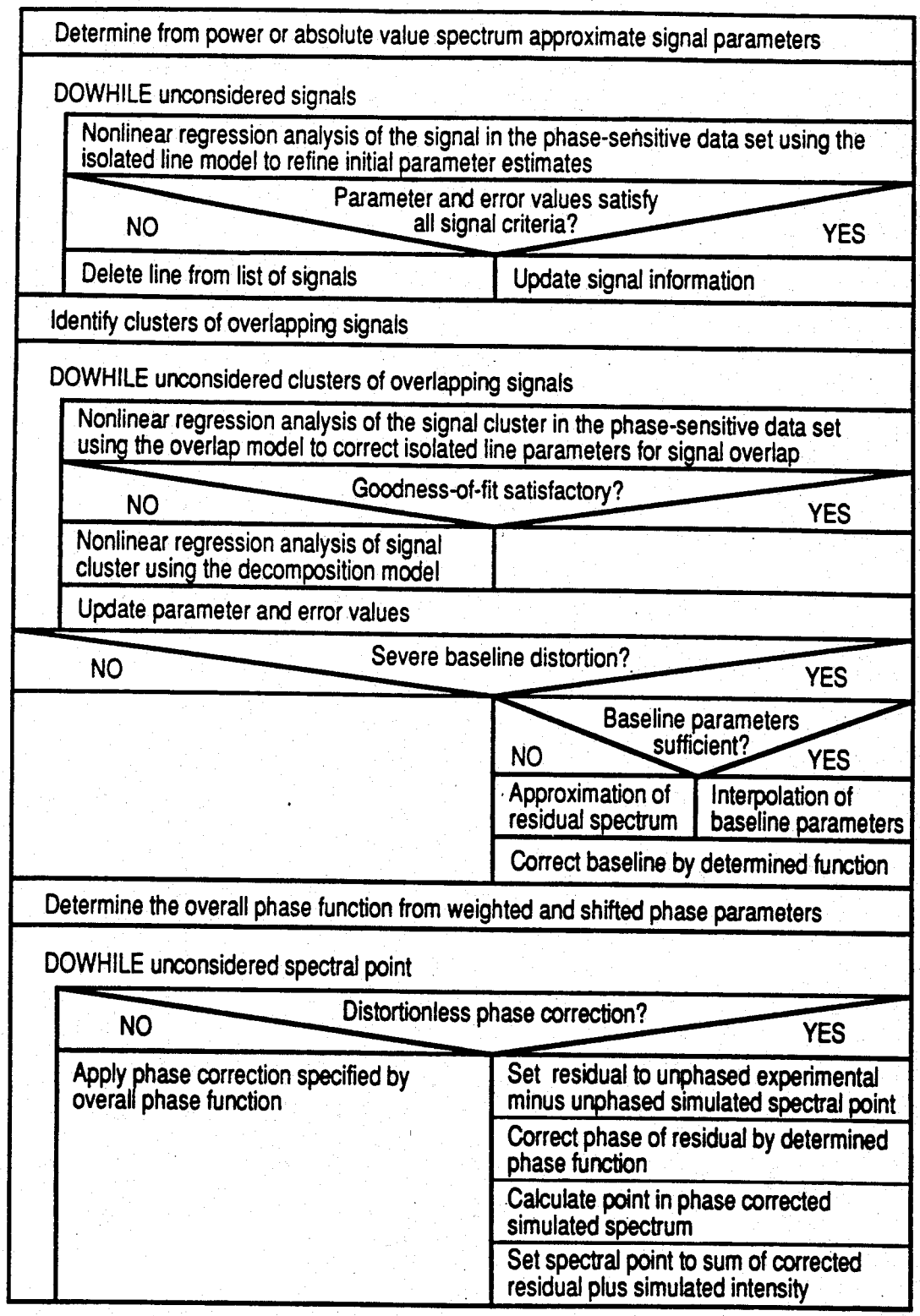

The Nassi-Shneiderman diagram of FIG. 8 summarizes the program flow of an autophasing method for frequency domain data in accordance with the invention. As indicated by the diagram, the initial step of the program is to determine from a power or absolute value spectrum approximate signal parameters. This is done for each signal that can be identified in the spectrum.

For each identified signal, a nonlinear regression analysis of the signal is performed using the initially determined parameters and adjusting the parameters, including phase parameters, until the best-fit of the model to the signal data is obtained. The model used in this step is the single line model. This operation is indicated in the diagram as "Nonlinear regression analysis of the signal in the phase sensitive data set using the isolated line model to refine initial parameter estimates". When a best-fit of the model to the data is obtained for a signal, an error analysis is performed to determine how good the fit actually is. This is indicated as "Parameter and error values satisfy all signal criteria?" If the goodness-of-fit is within preset criteria, the program advances through the "YES" branch to "Update signal information", meaning that the adjusted parameters determined are saved to be used in phasing and otherwise correcting the data. If the goodness-of-fit is not within the preset criteria, the program proceeds through the "NO" branch to discard information about that particular signal. When the criteria are not met, this generally means that the identified signal is not a valid signal.

This analysis works as a loop and is repeated as long as there are identified signals in the data which have not undergone the regression analysis.

When all identified signals have undergone regression analysis, a determination is made as to whether there are clusters of overlapping signals which need further analysis using an overlap model. This step is indicated by "Identify clusters of overlapping signals." A cluster of overlapping signals may generally be determined by finding that the fit of the model to the data is not very good, or by evaluating closeness of signal peaks and comparing it to signal width. If no clusters of overlapping signals are identified, the next loop operation is skipped and the program moves to the "Severe baseline distortion?" determination. If clusters of overlapping signals are identified, the program moves to a regression analysis of such overlapping signals using an overlap model. This is indicated by "Nonlinear regression analysis of the signal cluster in the phase-sensitive data set using the overlap model to correct isolated line parameters for signal overlap." During the regression analysis on a cluster of overlapping signals, the overlap model is fitted to the cluster of signals. When the best-fit of the model to the data is obtained, the "Goodness-of-fit" is evaluated and if satisfactory, the program progresses through the "YES" branch and updates the parameter values using the parameters calculated with the overlap model. If the "Goodness-of-fit" is not satisfactory, the program progresses through the "NO" branch to perform a "Nonlinear regression analysis of signal cluster using the decomposition model." Thus, if the signal is not satisfactorily defined by the overlap model, the signal is evaluated using the universal decomposition model for fitting the signal. While this is a universal model, it is usually more complex from a calculation standpoint and takes more computer time to solve. Thus, in this embodiment of the program, it is used as a last resort for signals which cannot be defined satisfactorily by the single line or overlap models. After evaluation using the decomposition model, the adjusted parameter resulting from the analysis are updated and stored.

When all clusters of overlapping signals have been evaluated, the program moves to determine if severe baseline distortion is present. If it is not, the program moves through the "NO" branch to the step of "Determine the overall phase function from weighted and shifted phase parameters." This involves using the various parameters determined and adjusted by prior steps to determine the overall phase function for the data. If severe baseline distortion is present, the program determines if the information from baseline parameters is sufficient to perform such correction. If "YES", an interpolation of the existing baseline parameters is made to provide a baseline correction function, and the baseline is corrected. If the existing baseline parameters are not satisfactory, a correction of the baseline through an "Approximation of residual spectrum" is performed and then the baseline corrected. With the baseline corrected, the program moves to "Determine overall phase function from weighted and shifted phase parameters."

The program then determines if it has been set to merely phase correct the data by application of the phase function to the data, or if a distortionless phase correction is desired. If only phase correction is desired, the program progresses through "NO" and applies the determined phase function to the data to provide phase corrected data. However, while such phase correction is the equivalent of the correction currently done by a spectroscopist, and produces a phase corrected signal generally better than can be produced manually or with currently available equipment, merely applying the phase function to the data results in the introduction of some baseline and signal shape distortion. In many cases it is desirably to not add this distortion. If distortionless phase correction is desired, the program moves through the "YES" branch to provide phase correction without additional distortion.

For the phase correction provided by the YES branch, the program first determines the unphased residual spectrum by subtracting the unphased simulated or modeled spectrum from the experimental spectrum. This residual spectrum includes the signals, noise, or other data not considered in the modeled calculated spectrum. The residual spectrum is then corrected using the determined phase function. The phase corrected simulated spectrum is then calculated. This is generally done by setting the phase parameters in the model to zero. This produces a calculated spectrum without addition of distortion. If all signals in the spectrum had been identified and utilized in the model fitting process, the calculated spectrum is an accurate phase corrected and distortionless representation of the data. However, because the system is not perfect and some signal information from the data may not have been considered by the model, in order to preserve and not lose such information it is preferred that the calculated spectrum and the corrected residual spectrum are then added to provide the final output corrected spectrum. This spectrum has been corrected for phase without introduction of additional distortions caused by the signals taken into account by the model, but information remaining in the residual spectrum is retained by adding such residual spectrum back to the calculated spectrum.

The above program which progresses from single line model to overlap model to decomposition model is usually used only with one-dimensional spectra. With multidimensional spectra, use of the single line model is usually satisfactory. N-dimensional spectra consist of $2^n$ data sets for the complete phase sensitive data and the data set is normally called "hyper-complex". The States-Haberkorn-Ruben method, see *Journal of Magnetic Resonance,* 1982, 48, 286, can be used for mixing intermediate data sets during the N-dimensional Fourier Transform to achieve phase sensitive spectra that can be phased to obtain pure absorption mode line shapes, when this is possible at all. The theoretical N-dimensional line shape is just a product of N 1D functions and can be efficiently calculated during the nonlinear regression analysis. For every dimension one normally needs three additional parameters, namely a transition frequency, a phase angle, and a line width. The number of parameters increases linearly with increasing dimensionality, while the number of points with significant information increases multiplicatively. For every additional dimension the number of phase sensitive data sets doubles and the number of points in any of these data sets increases by a factor equal to the number of points in the new direction. This tremendous increase in information about a signal results in an increased accuracy of the determined parameters. In addition, the signals are spread into several dimensions, thereby dramatically decreasing the risk of overlap and associated problems necessitating the use of the overlap or decomposition models.

Example Phase and Baseline Correction of a 1D Spectrum Using Single Line Model

Figure 9:
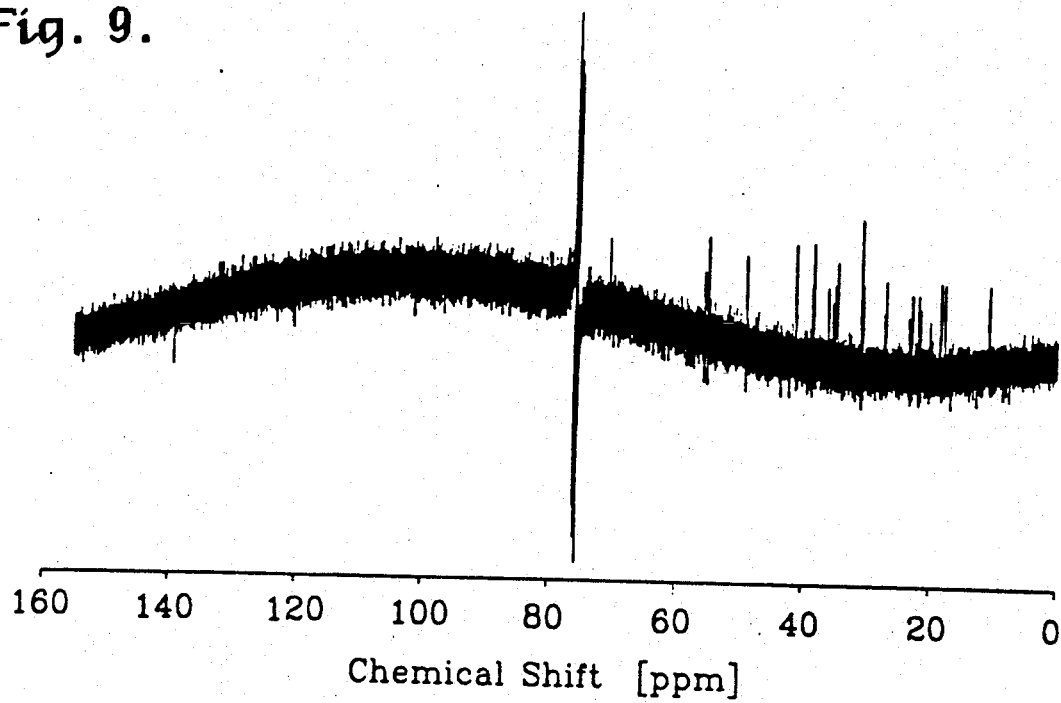

One-dimensional $^{13}C$ NMR spectra are particularly well-suited for testing autophasing systems since both the S/N ratio and digital resolution are often low due to the 1.1% natural abundance of $^{13}C$ and due to the wide chemical shift range of carbon, respectively. FIG. 9 shows the uncorrected proton decoupled 1D $^{13}$C-NMR spectrum of a 20 μmol sample of cholesterol (8 mg) in CDCl$_3$, acquired with 16 transients, 64,000 complex points, and a spectral width of 20,000 Hz on a 500 MHz Varian VXR spectrometer.

In order to demonstrate the stability of the autophasing algorithm with regard to baseline distortions, the first complex point was multiplied by a factor of 200, the second by 100 and the third by 2 prior to zero filling to 65,536 points and Fast Fourier Transform. Similar distortions will be produced by instrumental problems due to long recovery times or extensive time averaging of signals. The rms S/N ratio is below 10, except for the three strong solvent signals around 77 ppm. Calculations were done in point numbers and point distances rather than in frequency to avoid frequent transformations. The peak picking algorithm identified 46 signals above the noise level and determined the corresponding point numbers for the transition frequencies.

The model line shape was taken to be Lorentzian and the line width was assumed to be equal to the digital resolution, hence $\tau \approx 1/\pi$. Initial intensity values are not critical and were set to produce a signal height of ⅓ of the maximum intensity in the spectrum for all lines. The phase correction was based on 26 signals with parameter and error values from the nonlinear regression analysis that satisfied all signal criteria. For baseline correction, the zero$^{th}$ order baseline parameters from all regression analyses whose first order corrections were small in both the real and the imaginary data sets were used for interpolation.

Figure 10:
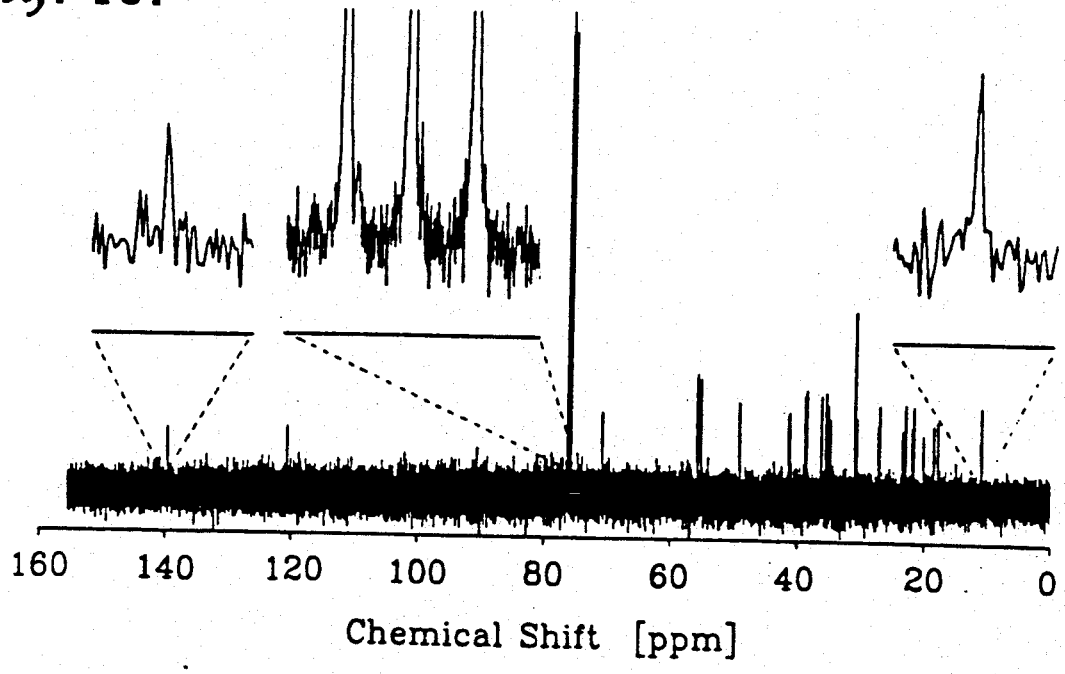

Since a frequency dependent phase correction gives a sufficiently linear phase shift over the width of a signal, a phase function according to Equation 3 can be used for smoothing and interpolation of determined phases. Neither a correction for peak overlap using the nonlinear regression analysis with an overlap model nor the use of a Lorentzian convoluted with a sinc function model, normally appropriate for these spectra, is necessary to get a sufficiently accurate phase correction. Baseline and phase corrections were applied and FIG. 10 shows the corrected spectrum. All signals in the spectrum are well-phased and the baseline is sufficiently flat.

Figure 11:
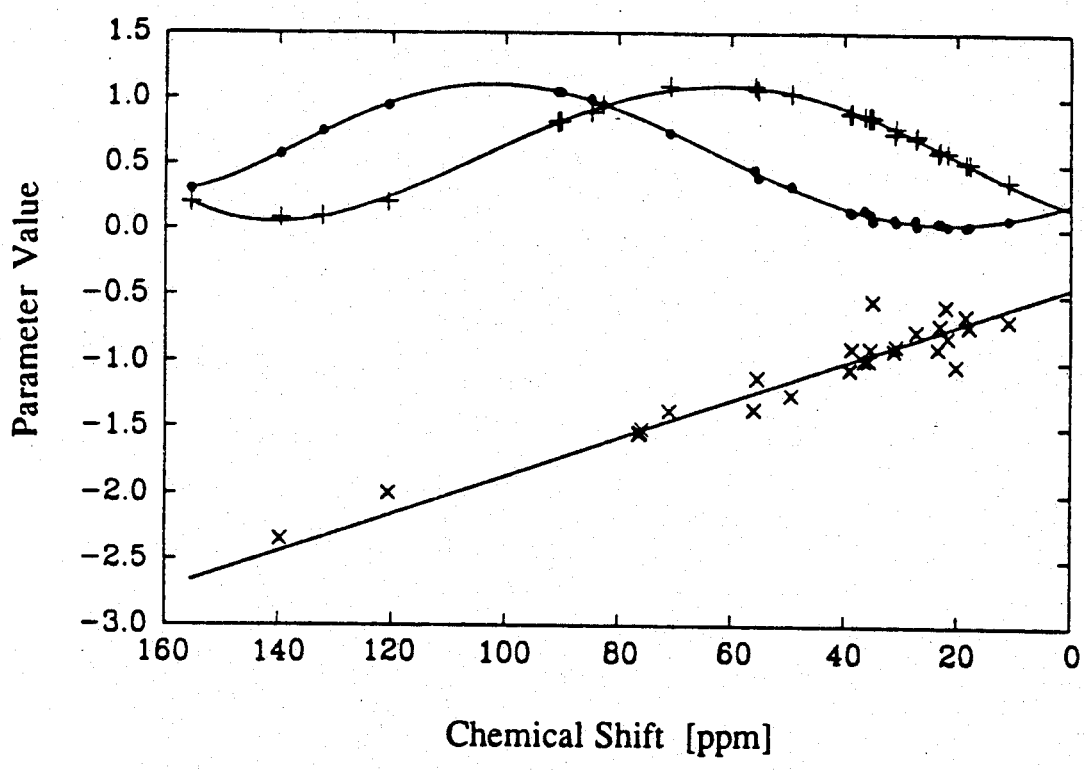
Figure 12B:
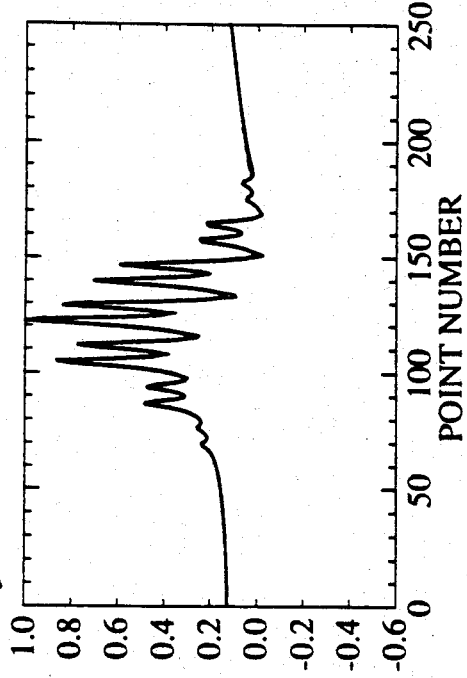
FIGS. 12a-12d are, diagrams showing several overlapping signals in the real and imaginary spectral regions before and after a phase correction using an overlap model.
Figure 12D:
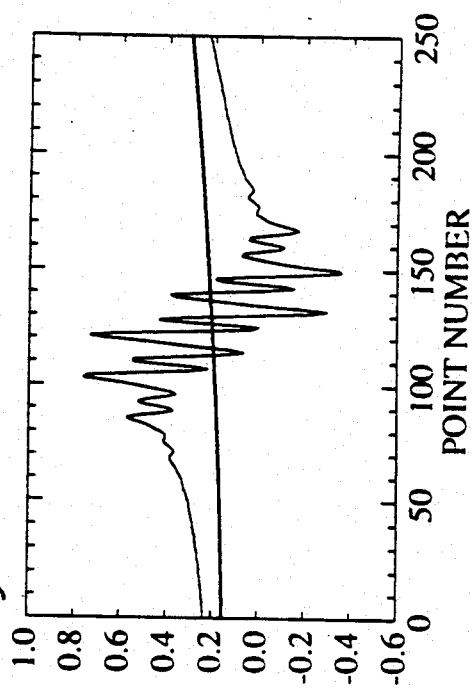
Figure 12A:
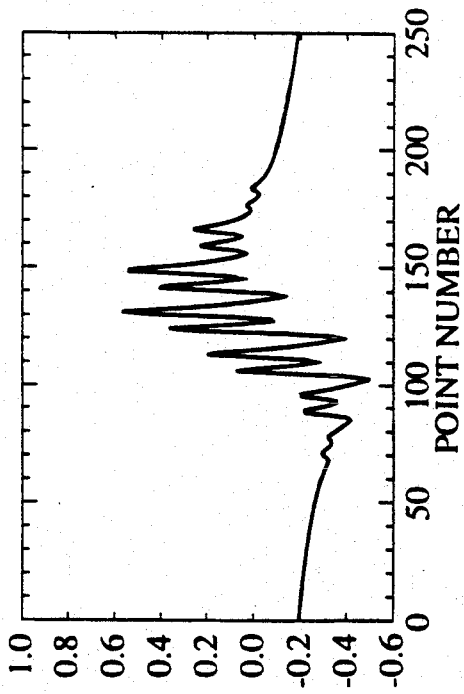
Figure 12C:
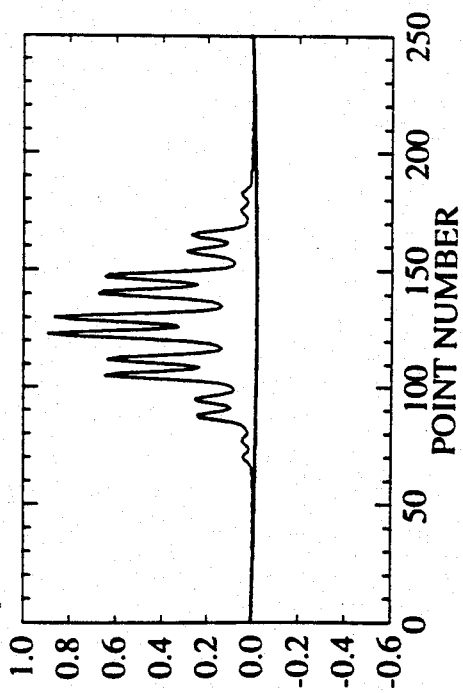
Figure 13B:
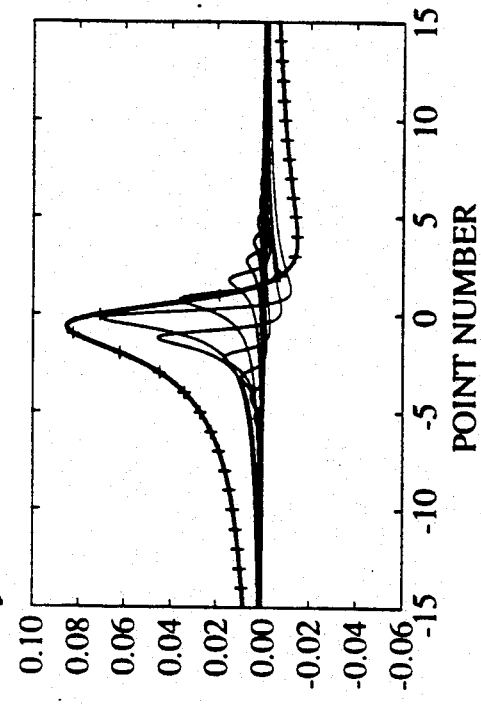
FIGS. 13a-13d are, graphic illustrations of the decomposition of a complex valued signal into a set of overlapping line shapes with and without a phase difference between signal and basis functions.
Figure 13D:
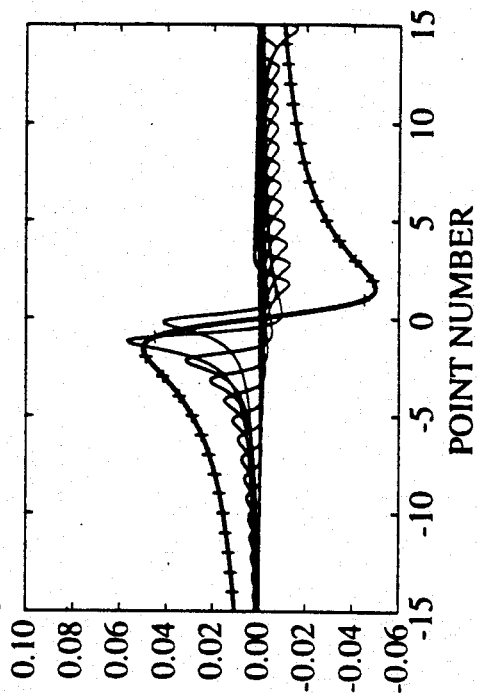
Figure 13A:
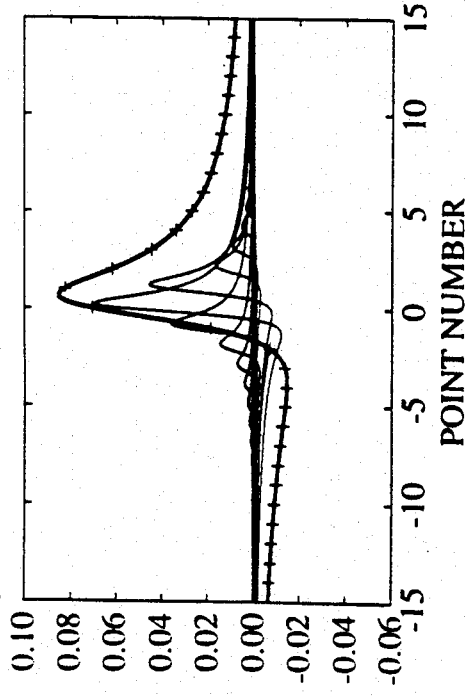
Figure 13C:
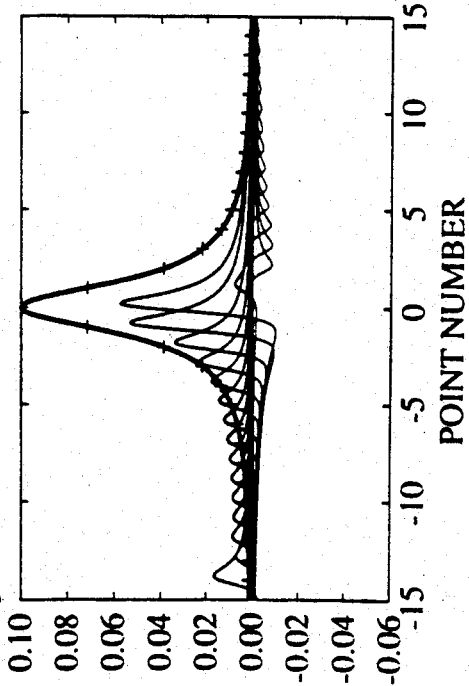

FIG. 11 shows the determined phase parameters (x) as well as the real ($\theta$) and imaginary (+) spectrum zero$^{th}$ order baseline parameters used for the correction. The phase values weighted by their error values were interpolated by a line. Baseline parameters of the real and imaged spectra were each approximated by the sum of the first six Legendre polynomials following the method of Person, *Journal of Magnetic Resonance*, 1977, 27, 265, who used four Legendre terms.

The Fourier Transform followed by determination and correction of phase and baseline of the whole spectrum took less than 10 second on an IBM RS6000 workstation, which is considerably faster the manual phase correction.

The Overlap Model

The single line model is normally sufficient for the phase correction of high resolution spectral data. However, if groups of partly or strongly overlapping signals are present, it is necessary to analyze such groups for the distortionless phase correction of spectra or for data without sufficiently isolated signals.

The decomposition model to be discussed later is capable of phase correcting data independently of both the number of signals present and the amount of overlap between signals. However, parameters determined by the decomposition model are averages over the signal region under consideration. In constrast, parameters determined by the use of the overlap model extract the maximum information from every signal in the region if a good fit can be obtained and these parameter estimates are generally preferable.

The overlap model consists of a sum of single line models. The number of lines in a region can be determined by fitting the single line model directly to signals in the data region as previously described. Such a step also provides starting values for the model parameters of the overlap model and by simultaneously fitting the sum of identified single lines to the data region, the parameter estimates are adjusted for the influence of overlap.

FIG. 12 shows plots of a region of overlapping signals from the NMR proton spectrum of menthol. In the upper plots A and B, the light line corresponds to the experimental data and the bold line to the best-fit overlap model of this region. For the identified 14 signals, frequency and amplitude were adjusted independently while a common phase and line width parameter were used. In contrast to a linear baseline term for the isolated line model, a second degree polynomial was used to model the baseline due to the wider spectral region. The unphased real (A) and imaginary spectrum (B) show a good agreement between experimental and simulated data and the difference is hardly visible in these plots.

The bottom row of the figure shows the determined phase corrected real (C) and imaginary (D) spectra with the determined (but not applied) baseline correction functions (bold line). The baseline distortion in the imaginary phase corrected spectrum is caused by dispersive tails from strong nearby signals outside the analyzed spectral range.

The Decomposition Model

The regression analysis with a single line or overlap model contains the assumption of a particular signal shape expressed by the model equation. Free parameters in this equation are provided, such as transition frequency, line width, phase, and amplitude, to allow adjustment of the model to the data.

In imaging and 1D spectroscopy the overlap of signals can become so severe that no fine structure of the overlap can be resolved. In NMR spectroscopy such resonances frequently arise from samples with positional (e.g. adsorbed species) or orientational dependencies (e.g. nonspinning powder samples) as well as signals from unshimmed magnets. These signals may all be referred to as heterogeneous signals which are not resolved into individual homogeneous signals.

All truly homogeneous signals in experimental absorption mode data are symmetrical and the unsymmetry and complexity of real data arises from the overlap of such signals. Instead of trying to describe the variety of observed line shapes with a single mathematical equation, the model for the regression analysis will now be extended to a system of equations whose solution describes the decomposition of the observed signal into an overlap of simple line shapes.

The two main considerations of such a decomposition model are the number of parameters to be estimated and the requirements concerning computer memory and processing time. For every point in a complex spectrum, the amplitude of the signal in the real and imaginary data set are known and hence a spectral region of n points could allow determination of 2n parameters. However, the number of parameters that can be determined will be considerably less, since the data frequently has a low S/N ratio and the signal shapes in the real and imaginary data are correlated.

The estimation of nonlinear parameters requires a compute intensive iterative adjustment of initial estimates. In contrast, linear parameters can be directly calculated without the necessity of initial estimates or iteration. All signals can be expressed as the product of the signal intensity times a line shape function. The line shape function is typically one of the homogenous line shapes in FIG. 2 and even the intensities of overlapping signals can be treated as linear parameters as long as all parameters in the line shape function are held constant.

For a useful decomposition of the observed signal, the calculated real and imaginary signal amplitudes should be equal to or at least similar to the observed spectral amplitudes. This requirement can be expressed as a set of linear equations. If the complex valued line shape of a single resonance i is represented as an n-dimensional column vector $\vec{a}_i$, and m such column vectors, each representing one of the partly overlapping signals, are collected in the n times m design matrix $\hat{A}$, then the constraints for n spectral points can be written as $$\hat{A} \times \vec{I} = \vec{G} \qquad [7]$$

where the vector $\vec{I}$ represents the intensity parameters (to be determined) of the assumed single line models and vector $\vec{G}$ represents the observed spectral amplitudes.

Several additional assumptions are necessary to use Eq. 7 for spectral phase and baseline correction. A trivial solution of the overlap model is obtained if only one intensity parameter is real-valued and all other components of the intensity vector $\vec{I}$ are zero. Under these conditions the least-squares solution of Eq. 7, using best-fit parameters (e.g., phase, line width and frequency) for the single line shape is identical to fitting the single line model directly to the data. For determination of the nonlinear model parameters in the decomposition model, the evaluation of Eq. 7 can be iterated with varying nonlinear parameter values to optimize a predetermined criterion. The solution of an m-line overlap model is identical to the least-squares solution of Eq. 7 under the above conditions with m real-valued intensities. Hence the decomposition model includes the single line and the m-line overlap model as special cases.

The least-squares solution of the m-line overlap model might be under-determined even though the number of data points exceeds the number of parameters, since the data might not allow one to distinguish between several combinations of model parameters. This could happen for sever signal overlap without distinct maxima in conjunction with all m transition frequencies to be determined. The number of assumed overlapping signals in the decomposition model is only limited by the number of parameters to be determined. The above problem can be avoided by defining a grid of assumed resonance frequencies sufficiently dense to describe the observed data. The solution of Eq. 7 will yield zero intensity for assumed grid frequencies were no resonance occurred in the experimental spectrum.

The following assumptions were designed to minimize storage and processing requirements for evaluation of the decomposition model. If the grid of assumed resonance frequencies coincides with the spectral digitization points and the line shape, width and phase for all single line models in the equation are the same, then in Eq. 7 is a Hermitian Toeplitz matrix:

$$A = \begin{bmatrix} R_0 & R_{-1} & R_{-2} & \dots & R_{-n+1} \\ R_1 & R_0 & R_{-1} & \dots & R_{-n+2} \\ R_2 & R_1 & R_0 & \dots & R_{-n+3} \\ \dots & & & & \dots \\ R_{n-1} & R_{n-2} & R_{n-3} & \dots & R_0 \end{bmatrix} \qquad [8]$$

All elements R along any diagonal are identical and the system of linear equations with this Toeplitz matrix can be solved in only order $n^2$ operations, as opposed to $n^3$ operations needed for design matrices of a more general form. It is not necessary to store the Toeplitz matrix during the recursive solution of this set of linear equations and the number of storage locations needed is proportional to the number of points, n, in the spectrum.

Instead of solving this system of equations under the constraint that intensities be real valued, Eq. 7 is split into two linear systems of equations, one for the real and one for the imaginary values. This also avoids the more time-consuming complex arithmetic needed to solve the original system of equations. After the decomposition step, the real and imaginary intensity vectors contain the same information as the initial spectrum $\vec{G}$, but the data are now expressed in the basis functions described in the design matrix A.

FIG. 13 shows the decomposition of a homogeneous signal (bold line) into overlapping basis functions (light lines). The basis functions were chosen to possess Lorentzian shape with constant line width, transition frequencies that coincide with spectral digitization points and a phase angle of $\pi/4$ for the real (A and C) and $-\pi/4$ for the imaginary (B and D) data sets. The design matrix can be expressed in Toeplitz form and the solution of Eq. 7 will always yield a decomposition where the sum of basis functions is equal to the observed signal at all digitization points (marked by +).

Only if the phase of observed signal and assumed basis functions is identical as in the real (A) and imaginary (B) spectrum in FIG. 13, then all determined intensity parameters of basis functions are positive and the determined intensity distributions of real and imaginary spectrum are approximately equal. The line shape (bold line) in the real (C) and imaginary (D) spectrum at the bottom of FIG. 13 is well-phased but since the phase of the basis functions was chosed to be $\pm\pi/4$, the determined intensity distribution in both plots is neither equal nor are all determined intensity parameters positive.

An experimental spectrum is a superposition of homogeneous lines and the intensities determined by decomposition are approximately equal to the sum of intensities that would have been obtained by analyzing the isolated homogeneous lines separately. After imposing a penalty on unfavorable parameter values (e.g. setting determined negative intensities to zero) the parameter values can be used for spectrum simulation and the nonlinear model parameters are estimated through minimization of the squared difference of simulated and experimental complex spectrum. While a zero$^{th}$ order phase distortion does not change the shape of basis functions over the spectral width, a frequency-dependent phase correction distroys this symmetry and hence destroys the Toeplitz form of the design matrix in conjunction with increased storage and processing requirements for model evaluation. Alternatively, the estimated phase function can be applied directly to the data before evaluated of the decomposition model and hence preserve the Toeplitz form of the design matrix for the decomposition step. As mentioned before, the application of a frequency-dependent phase function causes signal distortions and baseline undulations and will produce less accurate results than keeping the data constant during the analysis.

The Nassi-Shneiderman diagram of FIG. 14 defines a response function for the decomposition model of the invention. This is the response function usable in FIG. 8 in the step "Nonlinear regression analysis of signal cluster using the decomposition model." In situations where it is known that the decomposition model must be used for an entire spectrum, such as with normal imaging spectra, a program of the invention can merely include the "Nonlinear regression analysis of signal cluster [not the entire data] using the decomposition model," and an additional step of applying the phase function and, if desired, the baseline function determined during the regression analysis to provide the corrected data.

The response function contains the problem specific information needed for use of a standard regression analysis program to determine best-fit parameters for the decomposition model for the data region under consideration. As shown, the initial step, A, is to get the spectrum or data to be analyzed. From the initial estimate of the baseline parameters which are provided by the regression analysis program, the response function calculates a baseline function in step B. In C the calculated baseline function is subtracted from the initial spectrum. Steps D and E apply to a special case and will be described later. In the general case, the program moves from C to F (set $\vec{F}=\vec{G}$) and calculates the coefficient matrix of the linear set of equations which represents the assumptions of the model and is determined on the basis of the chosen line shape function and the estimated line shape parameters. Next, step G, is to solve the set of linear equations for the linear model parameters representing intensities using a predetermined criterion, such as best real-valued intensities in a least-squares sense. In practice the system of linear equations is not solved using the Moore-Penrose generalized inverse of the design matrix as shown in step G, but by less complete intensive matrix decomposition techniques or by specialized schemes that take advantage of a particular characteristic of the design matrix. While various conditions can be imposed on the derived solution of the set of linear equations, in most cases it is less compute intensive to enforce such conditions by penalizing certain undesired solutions of the set of equations in the nonlinear regression analysis. Thus, while a constraint of non-negative intensities can be placed on the solution obtained in step G, step H can be included to set negative intensities to zero, as well as to penalize other undesired outcomes. After solving the set of linear equations to obtain all model parameters, the spectrum is simulated using the determined parameter values from step I and the spectrum of residuals corresponding to the goodness-of-fit of the model to the data is determined in step J. The regression analysis program will, based on this result, determine a new set of parameter values and reexecute the response function to determine the goodness-of-fit corresponding to the new set of parameter values. The process is iterated using the response function shown until best-fit is obtained.

In a special situation to reduce computational requirements for solving the set of linear equations it is assumed that the phase angle of the basis functions over the spectral width in step F is constant. When such assumption is made for the model, in order to determine frequency-dependent phase parameters, it is necessary to add steps D and E. In step D a phase function based on estimated or corrected phase parameters is calculated and this phase function is applied to the spectrum. The best linear model parameters are determined from this phase corrected spectrum (G) and the simulated spectrum of step I is compared to this spectrum in step F to determine the best-fit of both spectra. During further iterations, the baseline and phase parameters used in steps B and D as well as the line shape parameters used in step F are further improved by the regression analysis program.

Probably the best test for a phasing program is the correction of spectra with various shim distortions. Such an application of the program will be described later and FIGS. 27 and 28 show automatically phased spectra during an automated shimming run.

Baseline distortions in conjunction with an unknown phase and signal shape pose an additional problem. FIG. 15 shows the uncorrected $^{23}$Na NMR spectrum of a $Na_2MoO_4$ powder sample spum at 6 KHz and acquired on a VARIAN VXR200 spectrometer with a spectral window of 50 kHz. $^{23}$Na is a quadrupolar nucleus and the baseline distortions are caused by instrumental artifacts due to the early sampling of the F1D which lasts only a few milliseconds, and the phase distortions are caused by timing delays as described previously.

The baseline distortions can be expanded in a linear combination of basis functions and the baseline coefficients are treated as nonlinear model parameters. The best-fit baseline is calculated from the corresponding parameters and this function is subtracted from the experimental data before applying the phase correction followed by the decomposition step as described above.

The Fourier Transform (FT) is a linear operator and the distortion in the frequency spectrum caused by each individual point of the F1D can be calculated and a weighted sum of such spectra used for baseline correction of the spectrum in FIG. 15.

Each real F1D point corresponds to a delta function, $\delta_t$, at time t in the time domain spectrum. The FT of such a signal is given by $$FT[\delta_t] = \int_{-\infty}^{\infty} \delta_t e^{i\omega t}dt = \cos(\omega t) + i\sin(\omega t) \qquad [9]$$

Frequently the exponent in the Fourier integral is chosen to be negative, thus inverting the sign of the imaginary spectrum. The first real F1D point corresponds to a delta function at time zero and yields a complex frequency spectrum with a constant amplitude of one in the real and zero amplitude in the imaginary spectrum.

FIG. 17 shows the real (bold) and imaginary (light) functions from Eq. 9 over the width of a spectrum resulting from distortions of the real F1D points (left side) and the imaginary F1D points (right side) for points one to five. Decomposition of a frequency spectrum into a signal and a sum of these baseline functions allows one to determine and eliminate the influence of instrumental artifacts on the first few points in the F1D.

The width of the spectrum in FIG. 15 was taken as wide as necessary to avoid aliasing of dispersive signal tails. The spectrum was decomposed as described before and one fifth of signal intensities at both ends of the spectrum were set to zero to decrease the correlation between baseline and phase parameters. This kind of spectrum only contains positive absorption signals and determined negative intensities in the real and imaginary data set were penalized by setting the corresponding intensity parameters to zero. The real spectrum was simulated from the corrected imaginary intensities and vice versa to penalize a difference in the determined intensity spectra due to phase distortions. Minimization of the least-squares deviation of this simulated complex spectrum from the experimental spectrum yielded the phase and baseline corrected spectrum in FIG. 16.

Since frequency dependent phase corrections of the experimental spectrum distort the line shape and introduce additional baseline distortions, all phase distortions should be included in the model rather than changing the spectral data during the analysis. Instead of determination of a real and an imaginary spectrum of residuals by solving Eq. 7 separately for real and imaginary data sets, the spectrum of intensities should be determined in a least-squares sense from the complex data. Constraints such as non-negative intensities should be imposed on the solution of the set of linear equations rather than be approximately enforced by the use of penalty functions during the nonlinear regression analysis. It would also be preferable to use a grid of resonance frequencies with increased grid density in signal regions and decreased density at the edge of the spectrum.

None of these improvements can be implemented using a Toeplitz design matrix or a matrix solvable with equivalent efficient methods in memory and speed. However, with specialized hardware or the availability of faster computers, these improvements should be used. The incorporation of higher order phase distortions in the model, the intensity spectrum in a least-squares sense and the non-uniform grid density can be solved by matrix decomposition techniques such as singular value decomposition (SVD) and linear systems of equations with constraints can be solved by methods of linear programming (LP).

Time domain and frequency domain data are, in principle, equivalent and both domains have advantages and disadvantages. Basis functions for the decomposition model in the time domain are the inverse Fourier transformed frequency domain line shape functions from FIG. 2. These transformed functions are commonly referred to as decaying sinusoids. Since convolution in the frequency domain is equivalent to a simple product of functions in the time domain (convolution theorem), the use of frequency models describing the convolution of various line shapes is greatly simplified in the time domain. Furthermore, if the first few F1D points contain distortions, they simply can be excluded from the analysis rather than be detected and corrected after they have influenced all spectral points in the form of baseline distortions after the Fourier Transform. Unfortunately, the decomposition of time domain data requires the simultaneous analysis of all spectral signals and also requires the more time and space intensive matrix decomposition techniques for solution of the set of linear equations.

Phase Correction of Two-Dimensional INADEQUATE Spectra

The extension of this autophasing method to N-dimensional spectra is straightforward. The following example shows how to optimize this general approach for two-dimensional (2D) so-called Incredible Natural Abundance Double Quantum Transfer Experiment (INADEQUATE) spectra. If all four transitions caused by $^{13}C$-$^{13}C$ coupling are modelled simultaneously rather than as isolated lines, dependencies between these lines can be included in the model, which reduces the number of parameters needed. This also allows one to include the relative signs of the transitions in the model, making intensity parameters always positive, and to exclude incompletely suppressed signals from the phase detection since they do not fit the 4 line model.

A 2D-INADEQUATE spectrum of 1,1-dimethyltetralin described in R. Dunkel et al., *Journal of Magnetic Resonance*, 1990, 90, 290 is used here to demonstrate 2D autophasing. In the double quantum direction a Lorentzian line broadening of 80 Hz was applied to the data and the fitting was done using the model of a Lorentzian line convoluted with a sinc function.

The upper row of FIG. 18 shows the four transitions of the bond signal of carbons 1–2 in 1,1-dimethyltetralin in the real/real data set. The middle row contains the best-fit simulated data and the bottom row shows the residuals. The complete spectrum comprises 128 MBytes of data, and the complete hypercomplex data of the shown bond region in all four data sets contains about 0.03% of the spectral points.

The correlation coefficient of the linear phase function of all determined phase angels for bond regions in the shift direction in FIG. 19 of $R^2 = 0.999$ indicates that the autophasing method detects phases objectively and significantly more accurately than can be achieved by manual phasing. The phase shift of more than $2\pi$ across the spectrum is due to the removal of the severely distorted first point in all 2D-F1Ds in the $t_2$-direction. An additional baseline correction was not necessary.

The simple assumptions valid for 1D spectra can break down for higher-dimensional spectroscopy, and phases in the double quantum dimension, see FIG. 20, are not only correlated with frequency but also with the extent of second order effects present in every bond signal. Hence, a frequency-dependent phase function cannot be used in this direction and every quadruple of satellite lines has to be phased individually by the determined phase angle in the double quantum dimension. FIG. 21 shows the now well-phased transitions from FIG. 18. Normally only this real/real data set containing the pure absorption mode data is used in further steps of manual data manipulation and interpretation.

FIG. 22 gives the determined phase angles in shift direction for the 20 $\mu$mol sample of cholesterol shown as a 1D spectrum in FIG. 10. Since the $^{13}C$-$^{13}C$ coupling signals observed in the 2D spectrum are about one hundred times weaker than the $^{13}C$ signals in the 1D spectrum, the S/N ratio in the 2D spectrum is, despite additional signal averaging, too low for manual phasing and interpretation of the spectrum. Automated phase correction ca be easily done based on the determined phase parameters given in FIGS. 21 and 22. Since signals are below the noise level even after phase correction, manual interpretation is not possible but the interpretation can be done automatically by regression analysis as described by R. Dunkel, Ph.D. Thesis, University of Utah, Dec. 1990 (withheld from publication until April, 1990).

Magnet Shimming

Shimming can be described as finding the best electrical currents through the shim coils which produce as homogeneous a magnetic field over the sample volume as possible. The remaining inhomogeneity can be directly determined through magnetic field plots, but this method is time consuming and requires special equipment. An indirect way to determine the remaining inhomogeneity is through determination of the resonance frequency distribution of an isolated line in the spectrum.

The determined spectrum needs to be phase corrected and should also be deconvoluted to remove the "smearing effect" caused by the line width of resonances, to determine the distribution of resonance frequencies. Phase correction and deconvolution can be done simultaneously using the decomposition model. Sufficient digitization of a single resonance can be obtained with several hundred spectral points and an isolated line can be phase corrected with only a zero$^{th}$ order correction. Hence the design matrix of the decomposition model has Toeplitz form and deconvolution and phase correction can be done in a few seconds on current workstations.

Minimization of one of the $\zeta_p$ Norms $$\zeta_p(f) = \left[\int_0^1 |f(x)|^p dx\right]^{\frac{1}{p}}, p \geq 1 \qquad [10]$$

gives a unique best linear approximation to a given function, see John R. Rice, *The Approximation of Functions*, Addison-Wesley, 1964, 14. For a given position inside the sample, the magnetic field strength caused by a shim coil is proportional to the current flowing in the coil (Biot-Savart law). The inhomogeneity of a magnet is reduced by decreasing the difference of field strength over the sample volume by the linear combination of the magnetic field strengths produced by the shim coils.

Since the second and higher moments of a well-phased Lorentzian line diverge and can only be determined for limited spectral regions, the first moment related to the $\zeta_1$ norm will be used for shimming. FIG. 24 shows the residual proton signal acquired on a 500 MHz NMR instrument from a $D_2O$ sample spinning at 30 Hz. Due to severe magnet inhomogeneity the signal and the spinning sidebands are not clearly separated. The sample spinning is stopped and the $\zeta_1$ norm of the nonspinning sample is minimized by a Simplex algorithm. FIG. 27 shows the line shape improvements through adjustment of all 18 shims and the determined first moment of the phased signal shape is printed in the upper right edge of each plot. After about 300 acquired spectra (4 seconds total acquisition time each) the optimization terminated and FIG. 25 shows the improvements through rough autoshimming compared to FIG. 24 obtained after spinning of the sample is resumed. The spinning sidebands are now about 1% of the signal maximum and further adjustment of the spinning shims can be done using a spinning sample. FIG. 28 shows the further adjustment of shims $z^1$ through $z^5$ in about 200 iterations on a spinning sample of chloroform in acetone-$d_6$. The region for determination of the moment of resonance frequencies was reduced between spectra in the third and four$^{th}$ row in FIG. 28 to remove excess baseline from the calculation.

It is interesting to note that in FIGS. 27 and 28, during intermediate steps in the optimization of homogeneity, the amplitude of the signal maximum decreased and hence criteria based on signal height, such as the lock level, would have falsely indicated a worsening of homogeneity. FIG. 26 shows the final line shape improvement obtained by the adjustment of shims $z^1$ through $z^5$ using a spinning sample.

While decreasing a chosen moment of an isolated NMR signal through shim adjustments will lead to as homogeneous a magnet as possible, little guidance is provided during intermediate steps of the adjustment as to how shim currents should be changed for further improvement of magnet homogeneity and a heuristic strategy such as that employed by a Simplex algorithm has to be used for optimization.

Regression analysis can provide such guidance by incorporating shim distortions into the model. Best-fit shim parameters provide generally excellent guidance concerning which shims need to be adjusted. However, magnetic fields produced by shim coils deviate from their intended shape and remaining field distortions cannot be completely compensated for by the shim coils provided so that only an approximate solution is obtained. Hence, the regression analysis might need to be applied to a series of spectra till the homogeneity is sufficient.

The line shape models described before can be extended to include shim distortions and the extension for z shims will be described here. Magnetic fields are described by the expansion in spherical harmonics and this description reduces to a simple Taylor series for the magnetic field strength of z shims along the z-axis of a sample. A detailed description is given by Gwendolyn N. Chmurny and David I. Hoult in the *Concepts in Magnetic Resonance*, 1990, 2, 131.

FIG. 29 shows the resulting magnetic field strength of shims $z^1$ to $z^5$ over the length of the sample z-axis. Assuming a (normally uniform) distribution of spins in the sample along this axis, the projection of the corresponding field strength onto the magnetic field axis, normally in connection with binning of the data, will yield a histogram representing the distribution of resonance frequencies caused by the corresponding field distortion. This histogram corresponds to the intensity distribution determined by the decomposition model and reversal of the decomposition step (see step I in FIG. 14) yields a complex-valued simulated spectrum. FIG. 29 shows a well-phased Lorentzian line in the real (left) and imaginary (right) spectrum without and with the field distortions shown in FIG. 29 corresponding to shims $z^1$ to $z^5$.

The response surface for a fit of this model to a spectrum from a severely inhomogeneous magnet may show several minima and methods like surface mapping or simulated annealing should be used to locate the global minimum. Note, a simultaneous change of sign of all odd z shim functions will not change the appearance of the simulated spectrum.

While the relaxation time of spins severely limits the repetition time for data acquisition, the modeling of shim distortions is only limited by the available computational resources and can considerably speed up the shimming process.

Whereas this invention is here illustrated and described with reference to embodiments thereof presently contemplated as the best mode of carrying out such invention in actual practice, it is to be understood that various changes may be made in adapting the invention to different embodiments without departing from the broader inventive concepts disclosed herein and comprehended by the claims that follow.

I claim:

1. A method for phase correcting spectral and imaging data in need of such correction comprising the steps of:
   a. obtaining data to be corrected, said data including at least one signal in the data;
   b. estimating preselected parameters of at least one signal in the spectral data, said parameters including a phase parameter;
   c. inserting relevant estimated preselected parameters for a particular signal into a predetermined mathematical model of expected spectral data;
   d. adjusting the initial estimates of preselected parameters through regression analysis with the mathematical model to obtain adjusted estimates of the preselected parameter representing the best-fit of the mathematical model to th particular signal;
   e. determining phase corrected data using the adjusted estimates of selected parameters for each signal for which adjusted estimates were obtained.

2. A method for phase correcting spectral and imaging data according to claim 1, wherein the mathematical model includes phase parameters.

3. A method for phase correcting spectral and imaging data according to claim 2, wherein the data includes more than one signal, wherein preselected parameters are estimated for a plurality of signals, wherein steps c and d are repeated for each of the plurality of signals so that the initial estimates of preselected parameters are adjusted to obtain adjusted estimates of said parameters separately for each signal through regression analysis for each of the plurality of signals for which initial estimates of parameters have been made, and wherein the adjusted estimates of selected parameters determined for each of the plurality of signals are used in determining the phase corrected data.

4. A method for phase correcting spectral and imaging data according to claim 3, wherein the phase corrected data are determined by using frequency parameters and the adjusted estimates of phase parameters to obtain a correction function, and applying the correction function to the data in need of correction.

5. A method for phase correcting spectral and imaging data according to claim 3, wherein the phase corrected data are simulated by setting the phase parameters to zero, and calculating the simulated corrected data from the predetermined mathematical model using the phase parameters set to zero and other selected adjusted estimates of parameters.

6. A method for phase correcting spectral and imaging data according to claim 3, wherein the phase corrected data are determined by:
   f. using the adjusted estimates of parameters and the predetermined mathematical model, calculating a simulation of the data to be corrected;
   subtracting the calculated simulation of the data to be corrected from the data to be corrected to obtain a residual spectrum without the signals for which preselected parameters were estimated;
   h. using frequency parameters and the adjusted estimates of phase parameters to obtain a correction function, and applying the correction function to the residual spectrum to thereby phase correct the residual spectrum;
   i. simulating the phase corrected data by setting the phase parameters to zero, and calculating the simulated corrected data from the predetermined mathematical model using the phase parameters set to zero and the other adjusted estimates of parameters; and
   j. adding the phase corrected residual spectrum obtained in step h to the simulated phase corrected data of step i to produce phase corrected data.

7. A method for phase correcting spectral and imaging data according to claim 6, including the additional step of determining from the residual spectrum a baseline correction function, and using the baseline correction function to correct the data for baseline distortion.

8. A method for phase correcting spectral and imaging data according to claim 7, wherein the baseline correction function is applied to the residual spectrum to correct the residual spectrum for baseline distortion before addition of the residual spectrum to the simulated phase corrected data.

9. A method for phase correcting spectral and imaging data according to claim 3, wherein the predetermined mathematical model takes into account baseline distortion to provide adjusted baseline parameters, and the adjusted baseline parameters are used to correct the data for baseline distortion.

10. A method for phase correcting spectral and imaging data according to claim 3, wherein the predetermined mathematical model of the expected spectral data defines signals in the expected spectral data to have a shape defined substantially as a convolution of a Lorentzian and a sinc function.

11. A method for phase correcting spectral and imaging data according to claim 3, including, after adjusting the parameters for each of the plurality of signals, the additional steps of:
   k. identifying sets of overlapping signals in th plurality of signals;
   l. inserting the adjusted estimates of parameters for each of the signals in one set of overlapping signals into a predetermined overlap mathematical model of expected spectral data that takes into account the overlap of the signals;
   m. correcting the adjusted estimates of parameters for each of the signals in the set of overlapping signals for the effect of overlap through regression analysis with the overlap mathematical model;
   n. repeating steps l and m for each additional identified set of overlapping signals to obtain corrected adjusted estimates of parameters for each of the determined overlapping signals; and
   o. using the corrected adjusted estimates of parameters in subsequent steps in place of the adjusted estimates of parameters for each signal for which corrected adjusted estimates have been obtained.

12. A method for phase correcting spectral and imaging data according to claim 11, wherein sets of overlapping signals are identified as those signals for which a predetermined measure of fit between the predetermined mathematical model and the signal is not obtained through the process of claim 3.

13. A method for phase correcting spectral and imaging data according to claim 11, wherein sets of overlapping signals are identified by determining signal peaks and the separation of such peaks and comparing such separation to a predetermined function of signal widths.

14. A method for phase correcting spectral and imaging data according to claim 11, including, after obtaining corrected adjusted estimates of parameters for signals in overlapping sets of signals, the additional steps of:
   p. identifying sets of overlapping signals which form heterogeneously broadened signals not satisfactorily defined by the predetermined overlap mathematical model;
   q. inserting relevant estimated preselected parameters for an identified heterogeneously broadened signal into a predetermined decomposition mathematical model which represents a predefined decomposition of heterogeneous signals into a superposition of homogeneous signals;
   r. revising the initial estimates of preselected parameters through regression analysis with the decomposition mathematical model to obtain revised estimated parameters for the signals included in the heterogeneously broadened signal;
   s. repeating steps q and r for each additional heterogeneously broadened signal identified; and
   t. using the revised estimates of parameters in subsequent steps in place of the adjusted estimates of parameters for each signal for which revised estimates have been obtained.

15. A method for phase correcting spectral and imaging data according to claim 14, wherein the decomposition mathematical model includes a set of equations, each equation defining the difference between the expected value at a location along the heterogeneous signal due to the superposition of homogeneous signals at that location and the measured value of the heterogeneous signal at that location.

16. A method for phase correcting spectral and imaging data according to claim 15, wherein the regression analysis using the decomposition mathematical model changes the parameters a plurality of times in obtaining revised parameters providing the best-fit of the model to the data and includes the step of solving the set of equations each time the parameters are changed.

17. A method for phase correcting spectral and imaging data according to claim 16, wherein it is assumed that the phase angle over the spectral width of the data to be analyzed is constant, wherein as part of the regression analysis the phase of the data is changed as well as the non-phase model parameters, and the best-fit of the model is to the phase changed data, the phase change of the data at best-fit representing the revised phase parameters.

18. A method for phase correcting spectral and imaging data according to claim 14, wherein the decomposition mathematical model takes into account baseline distortion whereby baseline distortion corrections are applied to the data in revising the parameters during regression analysis.

19. A method for phase correcting spectral and imaging data according to claim 1, wherein the phase corrected spectrum is also corrected for baseline distortion.

20. A method for phase correcting spectral and imaging data according to claim 19, wherein the predetermined mathematical model takes into account baseline distortion to provide adjusted base line parameters, and the adjusted baseline parameters are used to correct the data for baseline distortion.

21. A method according to claim 20, additionally including the steps of:
   u. estimating preselected parameters for a chosen portion of the spectral data for which parameters have not been estimated;
   v. inserting the estimated preselected parameters for the chosen portion of the spectral data not containing signals into the predetermined mathematical model of expected spectral data;
   w. adjusting the initial estimates of preselected parameters through regression analysis with the mathematical model to obtain adjusted estimates of the preselected parameters representing the best-fit of the mathematical model to the spectral data for the chosen portion of the spectral data;
   x. repeating steps u,v, and w for additional chosen portions of the spectral data; and
   y. using the adjusted baseline parameters determining a baseline distortion corrected spectrum.

22. A method for phase correcting spectral and imaging data according to the claim 1, additionally including the steps of:
   z. using the adjusted estimates of parameters and the predetermined mathematical model, calculating a simulation of the data to be corrected;
   aa. subtracting the calculated simulation of the data to be corrected from the data to be corrected to obtain a residual spectrum without the signals for which preselected parameters were estimated;
   bb. using frequency parameters and the adjusted estimates of phase parameters to obtain a correction function, and applying the correction function to the residual spectrum to thereby phase correct the residual spectrum;
   cc. simulating the phase corrected data by setting the phase parameters to zero, and calculating the simulated corrected data from the predetermined mathematical model using the phase parameters set to zero and the other adjusted estimates of parameters; and
   dd. adding the phase corrected residual spectrum obtained in step bb to the simulated phase corrected data of step cc to produce phase corrected data.

23. A method for phase correcting spectral and imaging data according to claim 22, additionally including determining from the residual spectrum a baseline correction function, and using the baseline correction function to correct the data for baseline distortion.

24. A method for phase correcting spectral and imaging data according to claim 23, wherein the baseline correction function is applied to the residual spectrum to correct the residual spectrum for baseline distortion before addition of the residual spectrum to the simulated phase corrected data.

25. A method for phase correcting spectral and imaging data according to claim 22, including the additional step between steps bb and cc of changing selected parameters to modify the calculated data in a desired manner.

26. A method for phase correcting spectral and imaging data according to claim 25, wherein selected parameters are changed to suppress unwanted signals in the corrected data.

27. A method for phase correcting spectral and imaging data according to claim 22, additionally including after step aa, the steps of:

ee. determining if any signals are present in the residual spectrum;

ff. if signals are determined as present in the residual spectrum, adding random noise to the spectrum to disguise such signals; and gg. performing steps bb on the residual spectrum with random noise added to obtain a spectrum corrected for baseline distortion.

28. A method for phase correcting spectral and imaging data according to claim 1, wherein the mathematical model represents a predefined decomposition of heterogeneous signals into a superposition of homogeneous signals.

29. A method for phase correcting spectral and imaging data according to claim 28, wherein the mathematical model includes a set of equations, each equation defining the difference between the expected value at a location along the heterogeneous signal due to the superposition of homogeneous signals at that location and the measured value of the heterogeneous signal at that location.

30. A method for phase correcting spectral and imaging data according to claim 29, wherein the regression analysis using the decomposition mathematical model changes the parameters a plurality of times in obtaining revised parameters providing the best-fit of the model to the data and includes the step of solving the set of equations each time the parameters are changed.

31. A method for phase correcting spectral and imaging data according to claim 30, wherein it is assumed that the phase angle over the spectral width of the data to be analyzed is constant, wherein as part of the regression analysis the phase of the data is changed as well as the non-phase model parameters, and the best-fit of the model is to the phase changed data, and wherein the phase change of the data at best-fit represents the revised phase parameters.

32. A method for phase correcting spectral and imaging data according to claim 1, wherein a plurality of phase parameters are determined, wherein the phase parameters are used to determine a phase function, wherein there are ambiguities in the determined phase parameters, and wherein the ambiguities are removed before determination of a phase function by the additional steps of:

determining from the method used for collection of the data the phase ambiguity which is equal to the minimum change of phase angles that will not change the appearance of the signal;

determining a desired range equal to the phase ambiguity shifting determined phase parameters outside the desired range by the number of phase ambiguities necessary to bring such phase parameters inside the desired range;

choosing a maximum allowed phase shift over the spectral frequency range of the data;

determining from the phase ambiguity and the maximum allowed phase shift, the maximum number of break points over the frequency range of the data;

dividing the determined phase parameters into a number of sets of adjacent phase parameters equal to one more than the number of break points, each phase parameter being in a maximum of two sets;

for each set of phase parameters, interpolating between the phase parameters in the set to obtain an interpolation function associated with the particular set;

for each interpolation function, positioning the phase parameters outside the associated set by allowing such phase parameters to be shifted by the phase ambiguity if such shift increases the closeness; interpolating all phase parameters as positioned as close as possible to the interpolation function to obtain a second interpolation function associated with each set;

determining the goodness-of-fit of the second interpolation function to all phase parameters included in the interpolation comparing the goodness-of-fit for each of the second interpolation functions selecting the second interpolation function with the best goodness-of-fit which does not extend beyond the maximum phase shift over the range of resonance frequencies as the phase function to be used for phase correcting the data.

33. A method for phase correcting spectral and imaging data according to claim 1, wherein the data is collected from a sample in a magnetic field, wherein the predetermined mathematical model takes into account shim distortions to provide adjusted shim parameters, and the adjusted shim parameters are used to correct distortions in th magnetic field.

34. A method for phase correcting spectral and imaging data according to claim 1, and useful for adjusting the shim currents in a magnet having shim coils and in need of shim adjustments, wherein the data to be corrected is spectral data obtained with a sample producing at least one isolated signal and using a magnet in need of shim adjustments, additionally including:

obtaining data using a magnet in need of shim adjustments with a sample producing at least one isolated signal of known shape;

phase correcting in accordance with claim 1 the spectral data obtained;

using the phase corrected data, calculating an adjustment criterion for such data, said criterion chosen to provide a single minimum corresponding to the best overall shim adjustment;

adjusting in increments the current in various shim coils;

obtaining additional spectral data for the sample with each adjustment of shim coil currents;

phase correcting in accordance with claim 1 each additional spectral data obtained;

calculating the adjustment criterion for each additional spectral data until a minimum in the adjustment criterion is obtained, the adjustment of shim coil currents when the criteria minimum is obtained being the best overall adjustment obtainable for such magnet.

* * * * *